(12) United States Patent
Lee

(10) Patent No.: US 11,626,419 B2
(45) Date of Patent: Apr. 11, 2023

(54) SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 262 days.

(21) Appl. No.: 17/147,237

(22) Filed: Jan. 12, 2021

(65) Prior Publication Data

US 2022/0077182 A1    Mar. 10, 2022

(30) Foreign Application Priority Data

Sep. 10, 2020   (KR) .......................... 10-2020-0116060

(51) Int. Cl.
| | |
|---|---|
| *H01L 27/11582* | (2017.01) |
| *H01L 27/11556* | (2017.01) |
| *H01L 27/11526* | (2017.01) |
| *H01L 27/11573* | (2017.01) |
| *H01L 27/11519* | (2017.01) |
| *H01L 27/11565* | (2017.01) |

(52) U.S. Cl.
CPC .. *H01L 27/11582* (2013.01); *H01L 27/11519* (2013.01); *H01L 27/11526* (2013.01); *H01L 27/11556* (2013.01); *H01L 27/11565* (2013.01); *H01L 27/11573* (2013.01)

(58) Field of Classification Search
CPC ...................... H01L 27/11582; H01L 27/11578
See application file for complete search history.

(56) References Cited

U.S. PATENT DOCUMENTS

| | | | |
|---|---|---|---|
| 8,754,459 B2 | 6/2014 | Higuchi et al. | |
| 9,530,788 B2 | 12/2016 | Oginoe et al. | |
| 9,728,266 B1 | 8/2017 | Goda et al. | |
| 10,381,362 B1* | 8/2019 | Cui | .............. H01L 21/76805 |
| 10,644,018 B2 | 5/2020 | Lee et al. | |
| 2015/0370705 A1 | 12/2015 | Yoon et al. | |
| 2018/0366483 A1 | 12/2018 | Choi | |
| 2020/0409592 A1* | 12/2020 | Yang | .................... G06F 3/0655 |

FOREIGN PATENT DOCUMENTS

| | | |
|---|---|---|
| KR | 1020190010403 A | 1/2019 |
| KR | 1020190051316 A | 5/2019 |

\* cited by examiner

*Primary Examiner* — Justin Seo
*Assistant Examiner* — Gillian Annelise Randall
(74) *Attorney, Agent, or Firm* — William Park & Associates Ltd.

(57) ABSTRACT

A semiconductor memory device, and a method of manufacturing the semiconductor memory device, includes a gate stack including interlayer insulating layers and word lines alternately stacked in a first direction, channel pillars passing through the gate stack and tapering toward the first direction, source select lines surrounding the channel pillars and extending to overlap the gate stack, and a source isolation insulating layer overlapping the gate stack between the source select lines and tapering toward a direction opposite to the first direction.

10 Claims, 32 Drawing Sheets

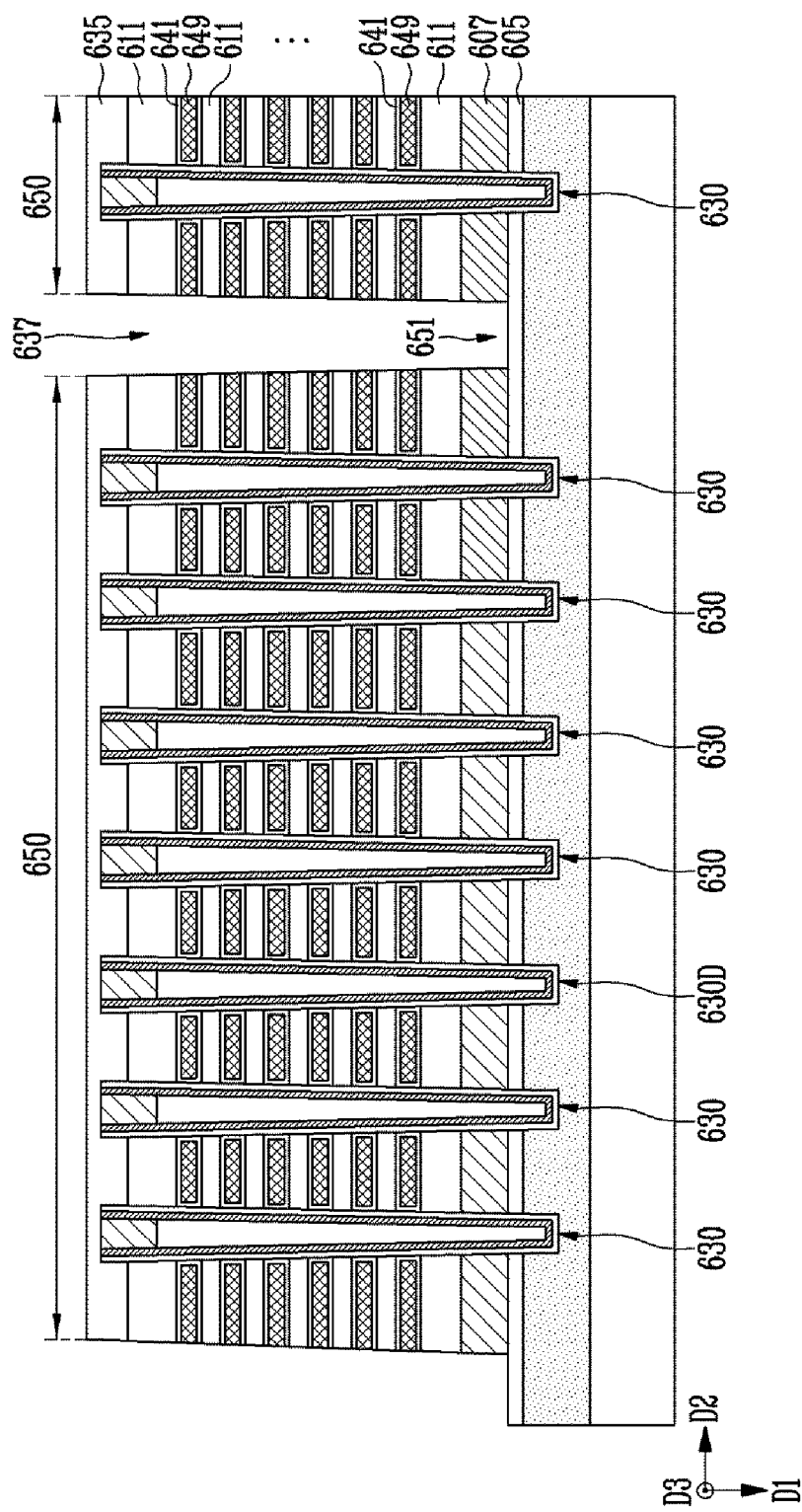

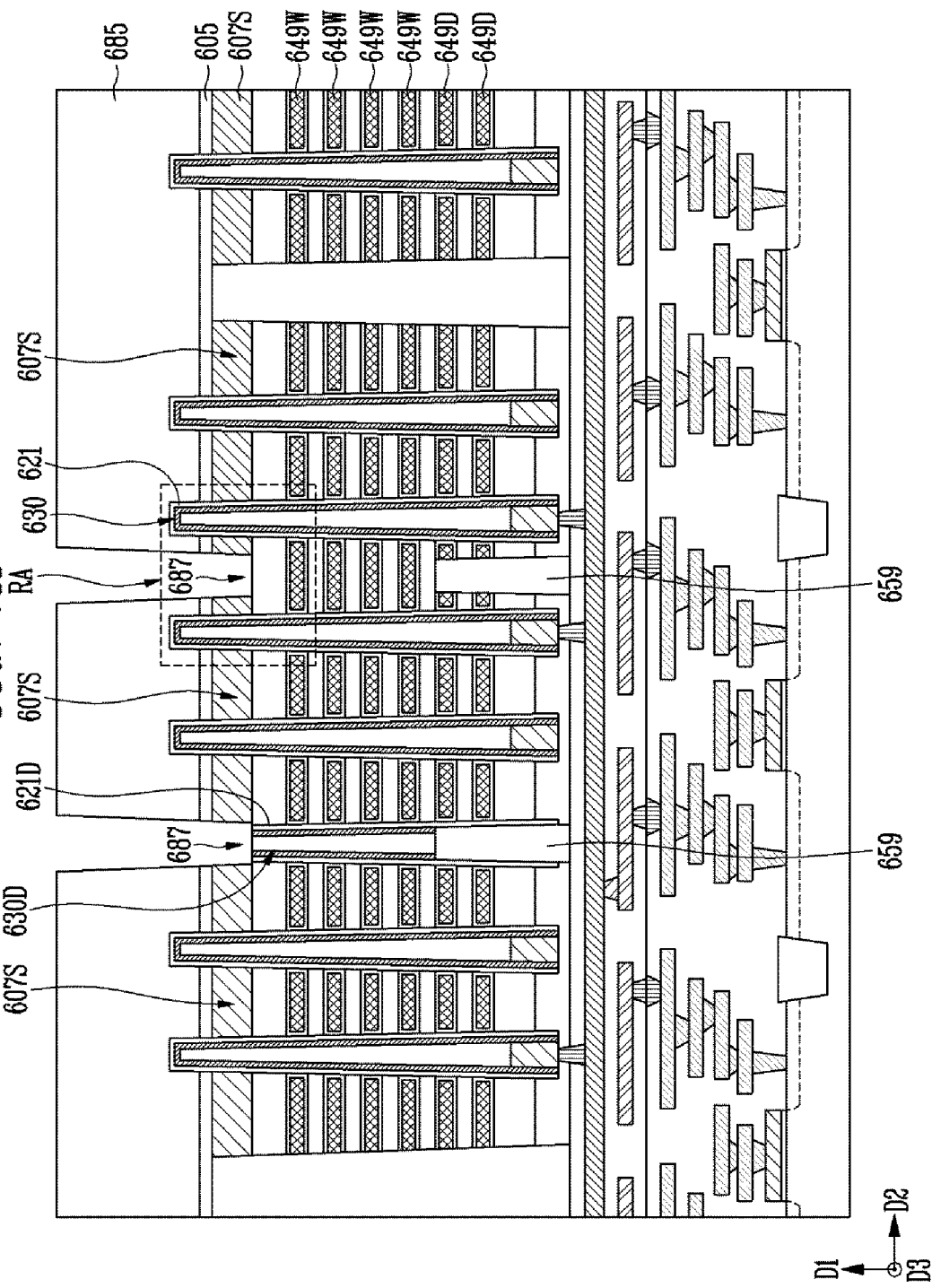

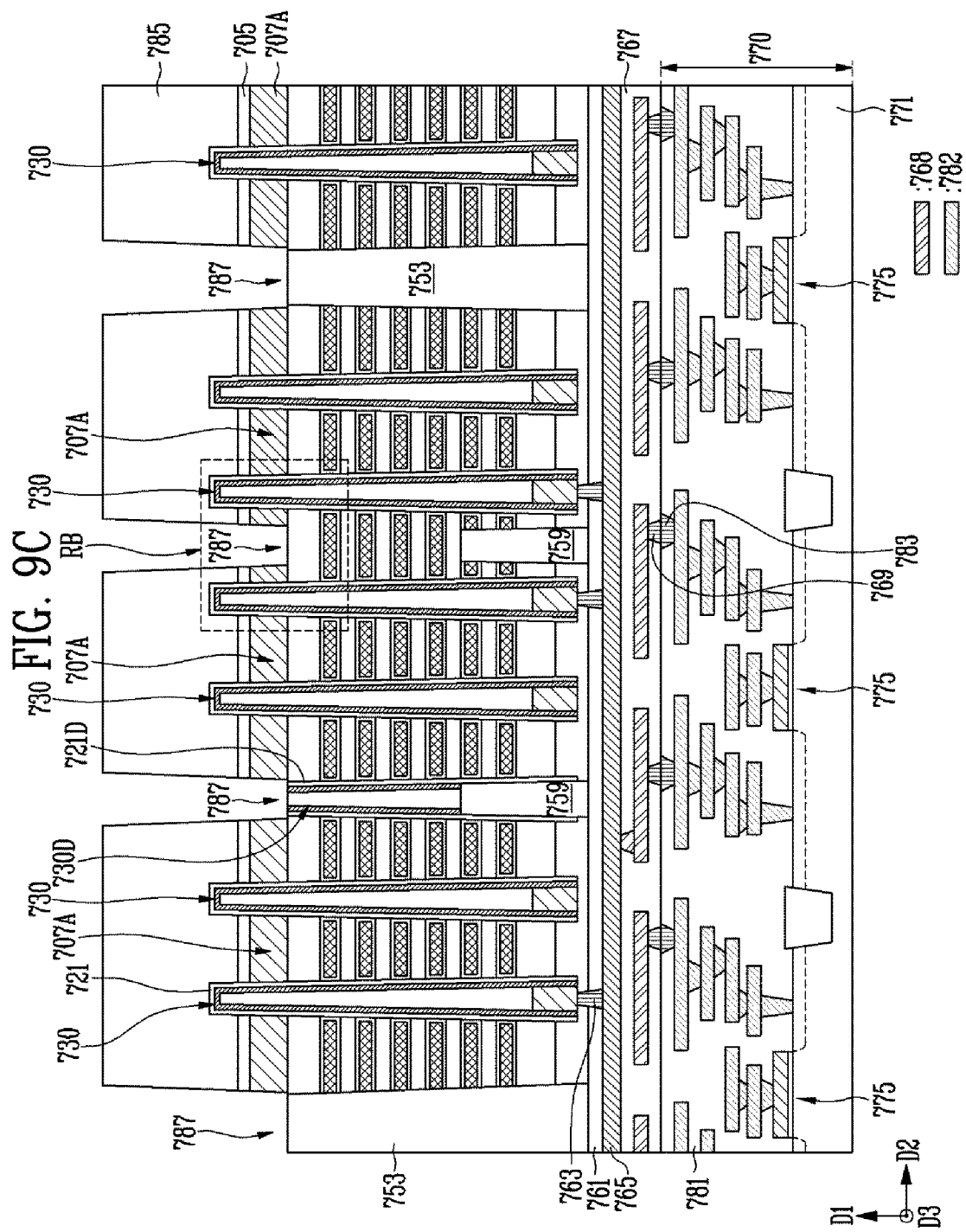

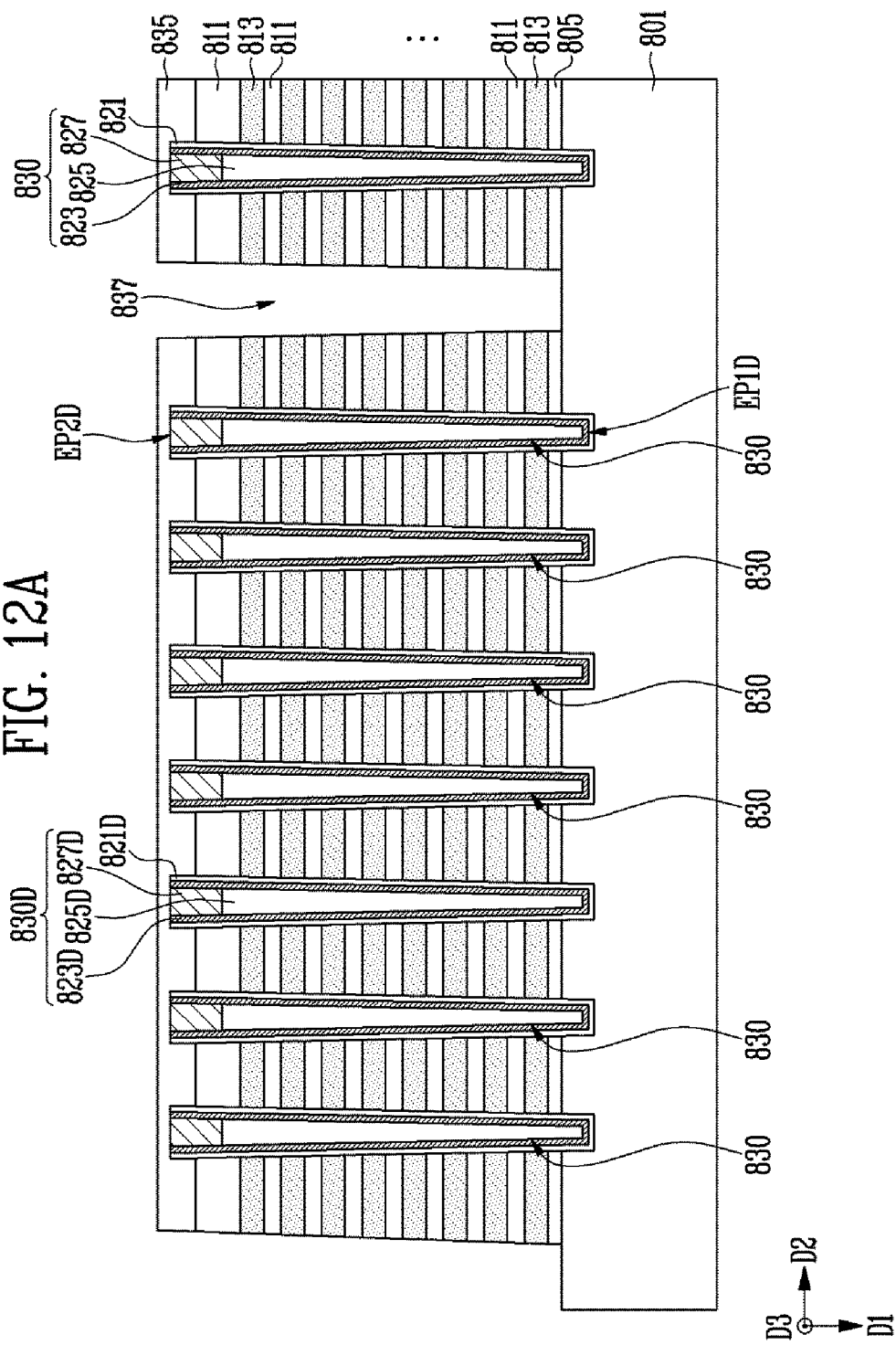

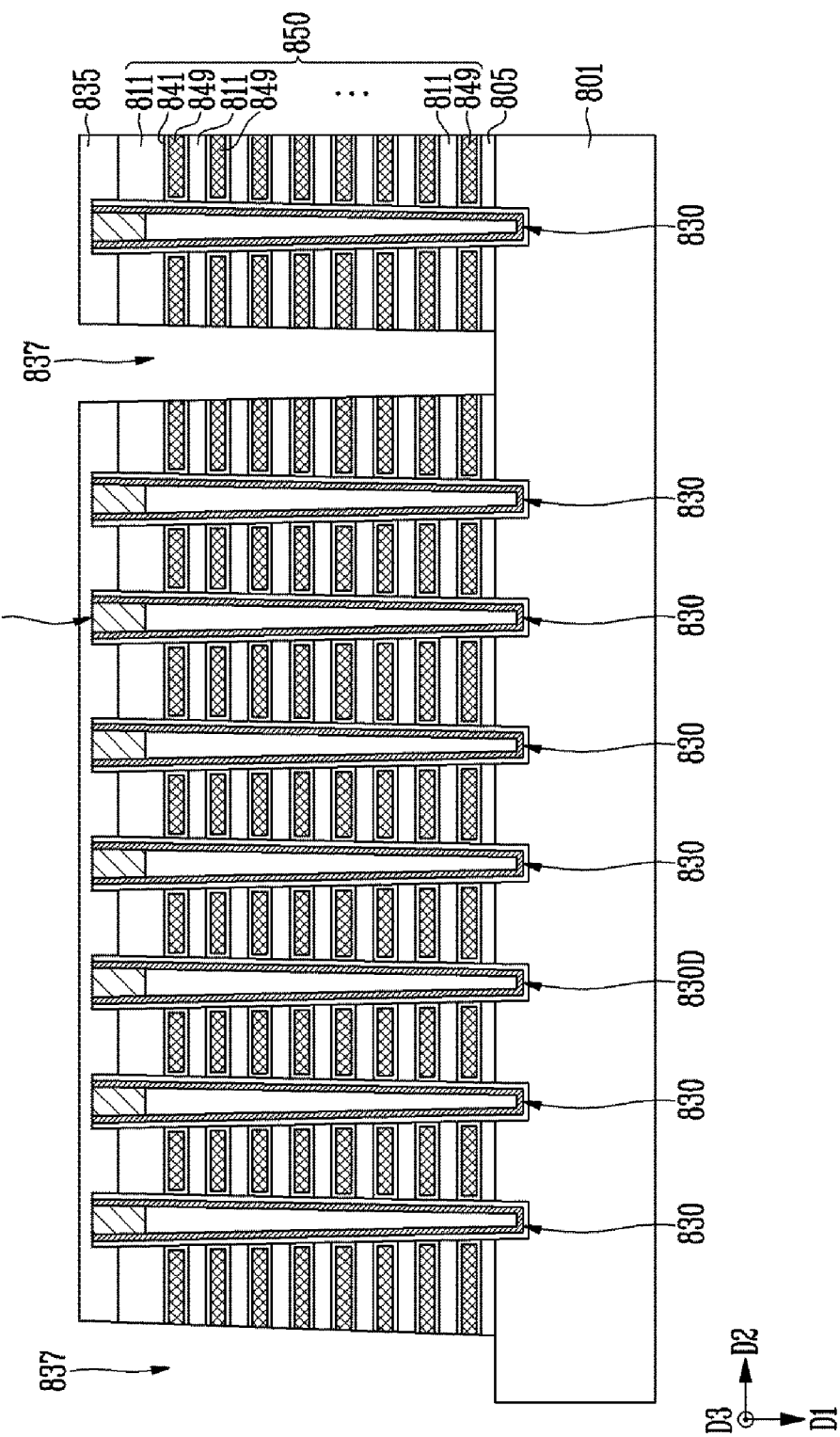

SEMICONDUCTOR MEMORY DEVICE

CROSS-REFERENCE TO RELATED APPLICATION

The present application claims priority under 35 U.S.C. § 119(a) to Korean patent application number 10-2020-0116060, filed on Sep. 10, 2020, in the Korean Intellectual Property Office, the entire disclosure of which is incorporated herein by reference.

BACKGROUND

1. Technical Field

The present disclosure may generally relate to a semiconductor memory device and a method of manufacturing the semiconductor memory device, and more particularly, to a three-dimensional semiconductor memory device and a method of manufacturing the three-dimensional semiconductor memory device.

2. Related Art

A semiconductor memory device includes a plurality of memory cells capable of storing data. A three-dimensional semiconductor memory device may include memory cells arranged in three-dimensions. The memory cells may configure a plurality of cell memory strings. The memory cell strings may be connected to word lines and select lines. The select lines may include source select lines and drain select lines.

SUMMARY

A semiconductor memory device according to an embodiment of the present disclosure may include a gate stack including interlayer insulating layers and word lines alternately stacked in a first direction, channel pillars passing through the gate stack and tapering toward the first direction, source select lines surrounding the channel pillars and extending to overlap the gate stack, and a source isolation insulating layer overlapping the gate stack between the source select lines and tapering toward a direction opposite to the first direction.

A method of manufacturing a semiconductor memory device according to an embodiment of the present disclosure may include forming a preliminary structure including channel pillars, interlayer insulating layers and conductive patterns, each of the channel pillars tapering to a first end facing in a first direction, the interlayer insulating layers and the conductive patterns surrounding the channel pillars and alternately stacked in the first direction, forming a trench passing through a first conductive pattern among the conductive patterns and tapering toward a direction opposite to the first direction, and forming a source isolation insulating layer filling the trench.

BRIEF DESCRIPTION OF THE DRAWINGS

FIGS. 7A to 7H are cross-sectional views illustrating a method of manufacturing a semiconductor memory device according to an embodiment of the present disclosure.

FIGS. 9A to 9C are cross-sectional views illustrating a method of manufacturing a semiconductor memory device according to an embodiment of the present disclosure.

FIGS. 12A to 12D are cross-sectional views illustrating a method of manufacturing a semiconductor memory device according to an embodiment of the present disclosure.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

Hereinafter, the terms 'first' and 'second' are used to distinguish one component from another component and are not meant to imply a specific number or order of components. The terms may be used to describe various components, but the components are not limited by the terms.

An embodiment of the present disclosure may provide a semiconductor memory device capable of improving an alignment margin of a source isolation insulating layer separating source select lines from each other and a method of manufacturing the semiconductor memory device.

Figure 1:
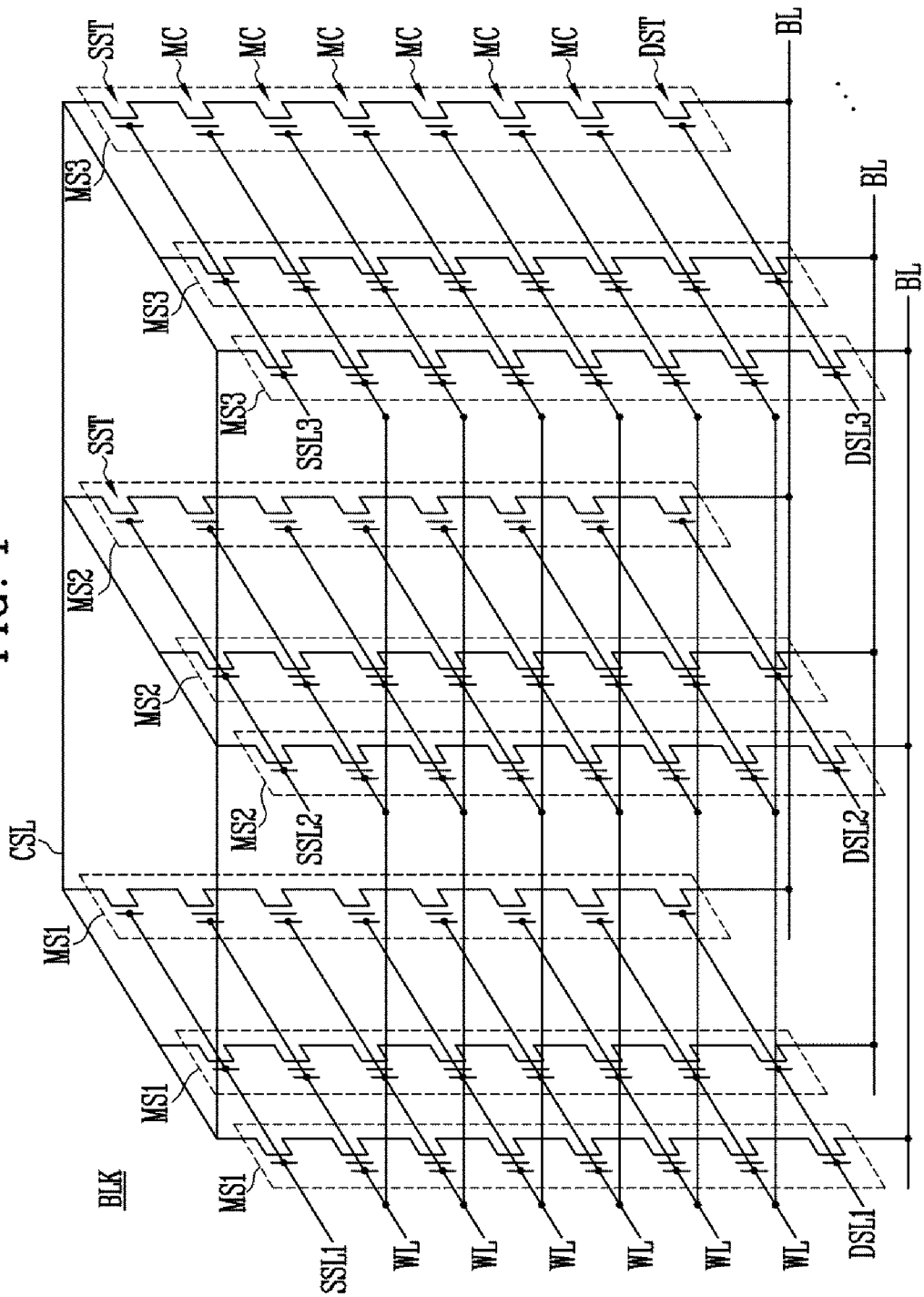
FIG. 1 is a circuit diagram illustrating a memory block of a semiconductor memory device according to an embodiment of the present disclosure.

FIG. 1 is a circuit diagram illustrating a memory block BLK of a semiconductor memory device according to an embodiment of the present disclosure.

Referring to FIG. 1, the semiconductor memory device may include a plurality of memory blocks BLK. Each memory block BLK may include a plurality of memory cell strings MS1, MS2, and MS3 connected to a common source layer CSL and bit lines BL.

Each of the memory cell strings MS1, MS2, and MS3 may include a plurality of memory cells MC connected in series, at least one source select transistor SST, and at least one drain select transistor DST. In an embodiment, each of the memory cell strings MS1, MS2, and MS3 may include one source select transistor SST connected between the plurality of memory cells MC and the common source layer CSL. In an embodiment, each of the memory cell strings MS1, MS2, and MS3 may include two or more source select transistors SST connected in series between the plurality of memory cells MC and the common source layer CSL. In an embodiment, each of the memory cell strings MS1, MS2, and MS3 may include one drain select transistor DST connected between the plurality of memory cells MC and the bit line BL. In an embodiment, each of the memory cell strings MS1, MS2, and MS3 may include two or more drain select transistors DST connected in series between the plurality of memory cells MC and the bit line BL.

The plurality of memory cells MC may be connected to the common source layer CSL via the source select transistor SST. The plurality of memory cells MC may be connected to the bit line BL via the drain select transistor DST.

Gates of the source select transistors SST disposed at the same level may be connected to source select lines SSL1, SSL2, and SSL3 separated from each other. Gates of the drain select transistors DST disposed at the same level may be connected to drain select lines DSL1, DSL2, and DSL3 separated from each other. Gates of the plurality of memory cells MC may be connected to a plurality of word lines WL. The word lines WL may be disposed at different levels, and gates of the memory cells MC disposed at the same level may be connected to a single word line WL.

Hereinafter, the present disclosure is described based on an embodiment in which the memory block BLK includes the first source select line SSL1, the second source select line SSL2, and the third source select line SSL3 separated from each other at the same level, and includes the first drain select line DSL1, the second drain select line DSL2, and the third drain select line DSL3 separated from each other at the same level. An embodiment of the present disclosure is not limited thereto, and the memory block BLK may include two source select lines separated from each other at the same level, or may include four or more source select lines separated from each other at the same level. Similarly, the memory block BLK may include two drain select lines separated from each other at the same level, or may include four or more drain select lines separated from each other at the same level.

The plurality of memory cell strings MS1, MS2, and MS3 may be connected to each of the word lines WL. The plurality of memory cell strings MS1, MS2, and MS3 may include a first group, a second group, and a third group individually selectable by the first source select line SSL1, the second source select line SSL2, and the third source select line SSL3. The first group may include the first memory cell strings MS1, the second group may include the second memory cell strings MS2, and the third group may include third memory cell strings MS3.

The first memory cell strings MS1 may be respectively connected to the bit lines BL via the drain select transistors DST connected to the first drain select lines DSL1. The second memory cell strings MS2 may be respectively connected to the bit lines BL via the drain select transistors DST connected to the second drain select lines DSL2. The third memory cell strings MS3 may be respectively connected to the bit lines BL via the drain select transistors DST connected to the third drain select lines DSL3. One of the first memory cell strings MS1, one of the second memory cell strings MS2, and one of the third memory cell strings MS3 may be connected to a single bit line BL.

The first memory cell strings MS1 may be connected to the common source layer CSL under control of the source select transistors SST connected to the first source select line SSL1. The second memory cell strings MS2 may be connected to the common source layer CSL under control of the source select transistors SST connected to the second source select line SSL2, and the third memory cell strings MS3 may be connected to the common source layer CSL under control of the source select transistors SST connected to the third source select line SSL3. Accordingly, the plurality of memory cell strings MS1, MS2, and MS3 may be divided into groups individually selectable at the same time for each of the source select lines SSL1, SSL2, and SSL3 during a read operation or a verify operation. In an embodiment, during the read operation or the verify operation, one of the first group of the first memory cell strings MS1, the second group of the second memory cell strings MS2, and the third group of the third memory cell strings MS3 may be connected to the common source layer CSL by selecting one of the first source select line SSL1, the second source select line SSL2, and the third source select line SSL3. Accordingly, an embodiment of the present disclosure may reduce a channel resistance compared to a case where the first memory cell strings MS1, the second memory cell string MS2, and the third memory cell strings MS3 are simultaneously connected to the common source layer CSL during the read operation or the verify operation. Therefore, an embodiment of the present disclosure may reduce read disturbance.

Figure 2:
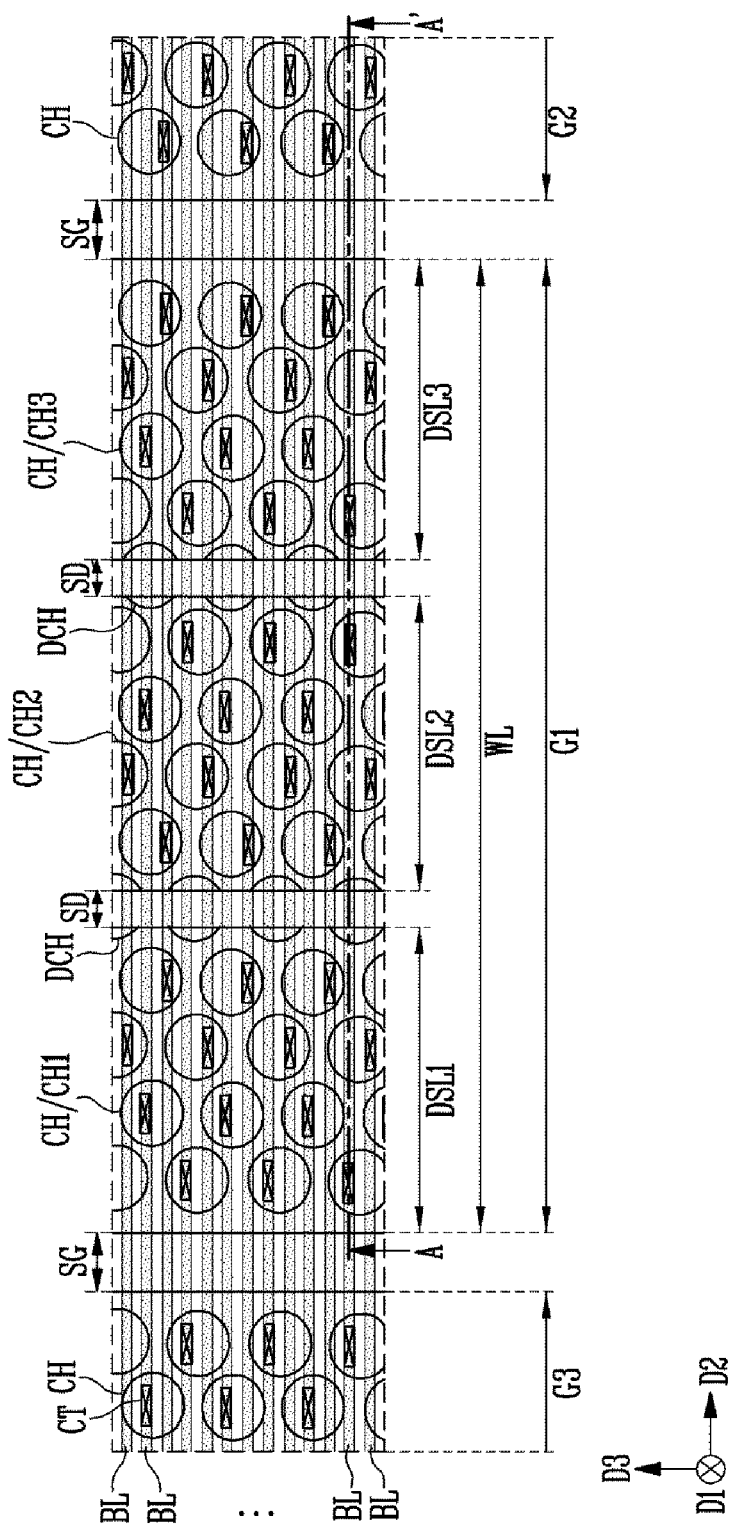
FIG. 2 illustrates a layout of gate stack, channel pillars and bit lines of the semiconductor memory device according to an embodiment of the present disclosure.

FIG. 2 illustrates a layout of gate stacks G1, G2, and G3, channel pillars CH, and bit lines BL of the semiconductor memory device according to an embodiment of the present disclosure.

Referring to FIG. 2, the gate stacks G1, G2, and G3 may be separated from each other by a gate isolation insulating layer SG. The gate stacks G1, G2, and G3 may surround the channel pillars CH extending in a first direction D1.

The channel pillars CH may be disposed in a plurality of rows arranged in a second direction D2 in a plane crossing the channel pillars CH, and a plurality of columns arranged in a third direction D3 in the plane crossing the channel pillars CH. In an embodiment, the plurality of channel pillars CH respectively passing through the gate stacks G1, G2, and G3 may include a first channel pillar CH1, a second channel pillar CH2, and a third channel pillar CH3 arranged to be spaced apart from each other in the second direction D2.

Each of the gate stacks G1, G2, and G3 may include the word lines WL and the drain select lines DSL1, DSL2, and DSL3.

In an embodiment, each of the gate stacks G1, G2, and G3 may include the first drain select line DSL1 surrounding the first channel pillar CH1, the second drain select line DSL2 surrounding the second channel pillar CH2, and the third drain select line DSL3 surrounding the third channel pillar CH3. The first drain select line DSL1, the second drain select line DSL2, and the third drain select line DSL3 may be spaced apart from each other in the second direction D2 by the drain isolation insulating layer SD. The first drain select line DSL1, the second drain select line DSL2, the third drain select line DSL3, and the drain isolation insulating layer SD may extend in the third direction D3. A shape of the drain isolation insulating layer SD may be various, such as a wave shape or a straight line shape.

The word lines WL may overlap the drain select lines DSL1, DSL2, and DSL3. Each of the word lines WL may extend in the second direction D2 to surround the first channel pillar CH1, the second channel pillar CH2, and the third channel pillar CH3. Each of the word lines WL may overlap the drain isolation insulating layer SD.

Each of the word lines WL may be penetrated by dummy channel pillars DCH. The dummy channel pillars DCH may overlap the drain isolation insulating layer SD. The dummy channel pillars DCH may be arranged in a line in an extension direction of the drain isolation insulating layer SD. Although not shown in the drawing, the dummy channel pillars DCH may be omitted.

The bit lines BL may extend in a direction crossing the drain select lines DSL1, DSL2, and DSL3. In an embodiment, the bit lines BL may extend in the second direction D2. The bit lines BL may be connected to the channel pillars CH via contact plugs CT. Each of the bit lines BL may be commonly connected to channel pillars controllable by different drain select lines DSL1, DSL2, and DSL3. In an embodiment, each of the bit lines BL may be commonly connected to the first channel pillar CH1 controllable by the first drain select line DSL1, the second channel pillar CH2 controllable by the second drain select line DSL2, and the third channel pillar CH3 controllable by the third drain select line DSL3.

Figure 3A:
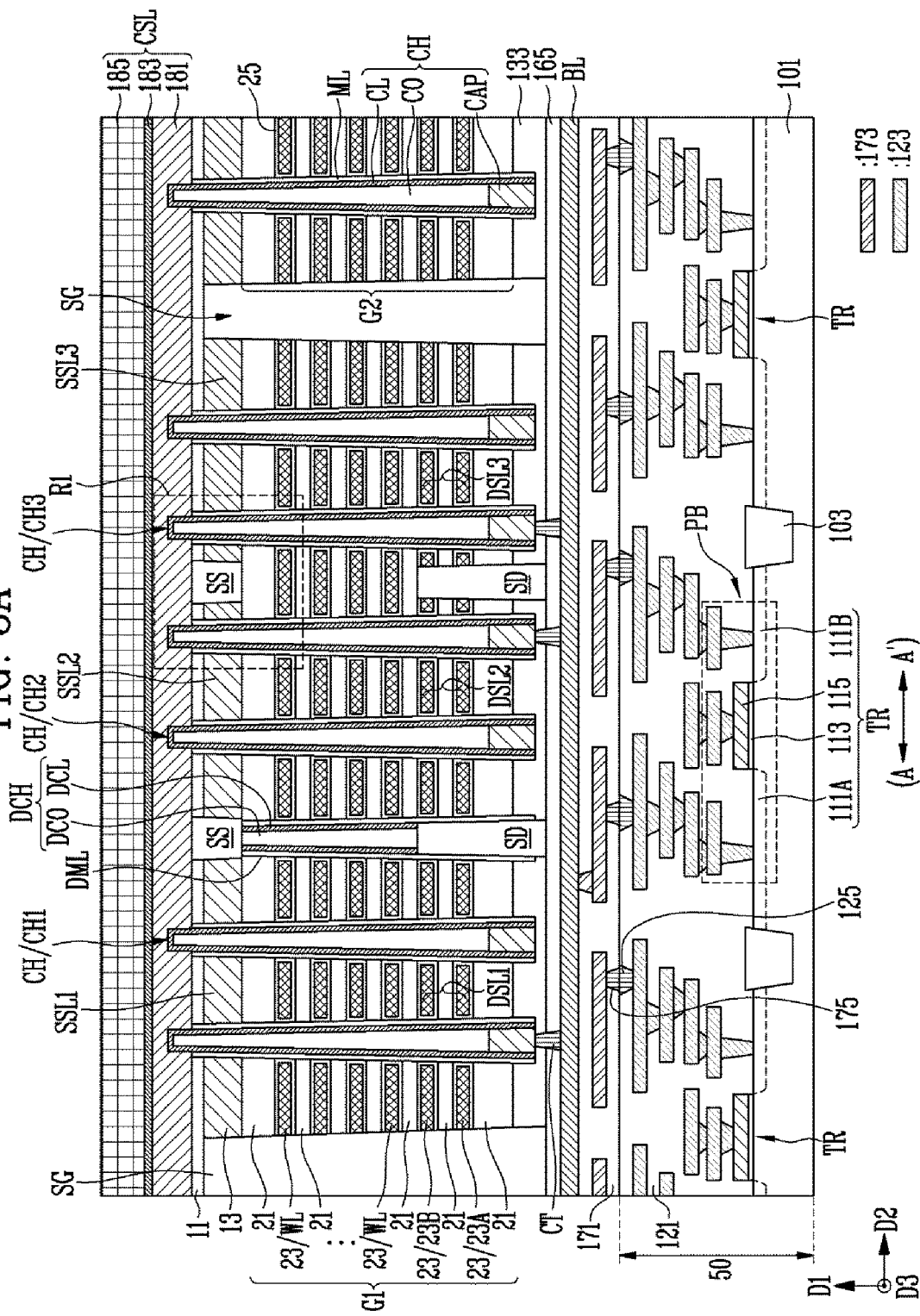
FIG. 3A is a cross-sectional view of the semiconductor memory device taken along a line A-A' shown in FIG. 2.
Figure 3B:
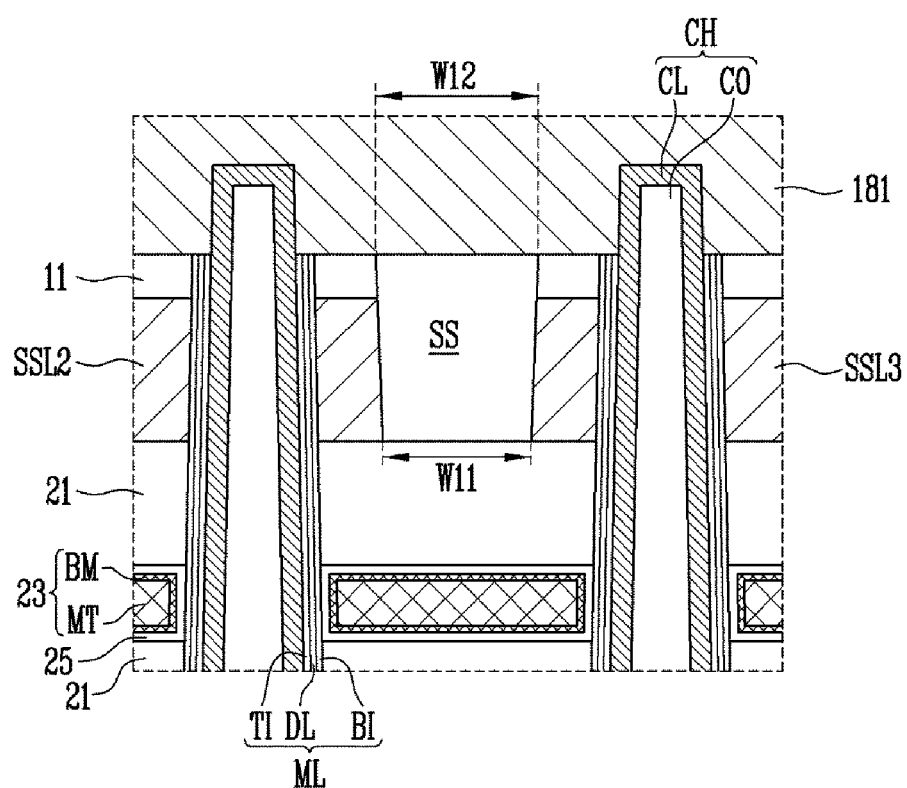
FIG. 3B is an enlarged cross-sectional view of a region R1 shown in FIG. 3A.

FIG. 3A is a cross-sectional view of a semiconductor memory device taken along a line A-A' shown in FIG. 2, and FIG. 3B is an enlarged cross-sectional view of a region R1 shown in FIG. 3A.

The line A-A' shown in FIG. 2 overlaps the dummy channel pillar DCH between the first channel pillar CH1 and the second channel pillar CH2, but does not overlap the dummy channel pillar DCH between the second channel pillar CH2 and the third channel pillar CH3.

Referring to FIG. 3A, the semiconductor memory device may include the common source layer CSL overlapping the bit line BL. The gate stacks G1 and G2 may be disposed between the common source layer CSL and the bit line BL. The semiconductor memory device may include a peripheral circuit structure 50. The bit line BL may be disposed between the gate stacks G1 and G2 and the peripheral circuit structure 50. The semiconductor memory device may include the source select lines SSL1, SSL2, and SSL3 overlapping each of the gate stacks G1 and G2. The source select lines SSL1, SSL2, and SSL3 may be disposed between each of the gate stacks G1 and G2 and the common source layer CSL.

The channel pillars CH may extend in the first direction D1 to pass through the gate stacks G1 and G2 and the source select lines SSL1, SSL2, and SSL3. The channel pillars CH may extend into the common source layer CSL. Each of the channel pillars CH may include a channel layer CL, a core insulating layer CO, and a capping pattern CAP. The core insulating layer CO and the capping pattern CAP may be disposed in a central region of the channel pillar CH. The core insulating layer CO may overlap the capping pattern CAP. The capping pattern CAP may include a doped semiconductor layer. In an embodiment, the capping pattern CAP may include doped silicon including an n-type impurity. The channel layer CL may surround a sidewall of the capping pattern CAP and a sidewall of the core insulating layer CO.

The channel layer CL may extend onto a surface of the core insulating layer CO facing the common source layer CSL. The channel layer CL may configure a channel region of the memory cell string. The channel layer CL may include a semiconductor layer. In an embodiment, the channel layer CL may include silicon.

The common source layer CSL may include a doped semiconductor layer 181 and a metal layer 185 stacked in the first direction D1. The common source layer CSL may further include a first metal barrier layer 183. The doped semiconductor layer 181 may include at least one of an n-type impurity and a p-type impurity. In an embodiment, the doped semiconductor layer 181 may include silicon doped with an n-type impurity. The common source layer CSL may be insulated from the source select lines SSL1, SSL2, and SSL3 by a first insulating layer 11. The first insulating layer 11 may extend between the common source layer CSL and each of the source select lines SSL1, SSL2, and SSL3.

The channel pillars CH may extend into the doped semiconductor layer 181 of the common source layer CSL. The channel layer CL of the channel pillar CH may be in contact with the doped semiconductor layer 181 of the common source layer CSL.

The source select lines SSL1, SSL2, and SSL3 may be separated from each other by a source isolation insulating layer SS. In other words, the source isolation insulating layer SS may be disposed between the source select lines SSL1, SSL2, and SSL3. The source isolation insulating layer SS may overlap a drain isolation insulating layer SD. The source isolation insulating layer SS may extend parallel to the drain isolation insulating layer SD. In an embodiment, the source isolation insulating layer SS may extend in the third direction D3. The source isolation insulating layer SS may extend in the first direction D1 to pass through the first insulating layer 11.

The source isolation insulating layer SS may have a tapered shape inversely to a tapered shape of each of the channel pillars CH. Each of the channel pillars CH may have a tapered shape that tapers toward the first direction D1. Accordingly, a distance between protrusions of the channel pillars CH extending in the first direction D1 beyond the gate stack G1 may be defined larger than a distance between portions of the channel pillars CH disposed inside the gate stack G1. Therefore, according to an embodiment of the present disclosure, a margin space to align the source isolation insulating layer SS between the protrusions of the channel pillars CH may be increased.

The source isolation insulating layer SS may have a tapered shape that tapers toward a direction opposite to the first direction D1. Accordingly, a width of an upper end of the source isolation insulating layer SS facing the common source layer CSL may be formed to be wider than a width of a lower end of the source isolation insulating layer SS facing the gate stack G1.

Because the channel pillars CH may have the tapered shape that tapers toward the first direction D1, a space between the channel pillars CH may become wider as the channel pillars CH approaches the common source layer CSL. Accordingly, the space between the channel pillars CH in which the upper end of the source isolation insulating layer SS is disposed may be defined wider than the space between the channel pillars CH in which the lower end of the source isolation insulating layer SS is disposed. As a result, the margin space to align the upper end of the source isolation insulating layer SS having a relatively wide width may increase between the channel pillars CH. Therefore, according to an embodiment of the present disclosure, an alignment margin of the source isolation insulating layer SS may be improved.

Each of the gate stacks G1 and G2 may include interlayer insulating layers 21 and conductive patterns 23 alternately stacked in the first direction D1. Each of the gate stacks G1 and G2 may surround the channel pillar CH with a memory pattern ML interposed between the channel pillar CH and each of the gate stacks G1 and G2. The memory pattern ML may extend along the sidewall of the channel pillar CH. The memory pattern ML may extend between each of the source select lines SSL1, SSL2, and SSL3 and the channel pillar CH.

The conductive patterns 23 may include the same conductive material. Each of the conductive patterns 23 may surround the channel pillar CH with a first blocking insulating layer 25 interposed between the channel pillar CH and each of the conductive patterns 23. The first blocking insulating layer 25 may be disposed between each of the conductive patterns 23 and the memory pattern ML. The first blocking insulating layer 25 may extend between each of the conductive patterns 23 and the interlayer insulating layer 21.

The conductive patterns 23 may be used as the word lines WL and the drain select lines DSL1, DSL2, and DSL3. At least one layer among the conductive patterns 23 adjacent to the bit line BL may be used as the drain select lines DSL1, DSL2, and DSL3, and the remains may be used as the word lines WL. In an embodiment, the drain select lines DSL1, DSL2, and DSL3 may include the first to third drain select lines DSL1 to DSL3 of two layers configured of conductive patterns 23A of a first level and conductive patterns 23B of a second level adjacent to the bit line BL. The drain select lines DSL1, DSL2, and DSL3 may be spaced apart from each other at the same level by the drain isolation insulating layer SD. The drain isolation insulating layer SD may have a tapered shape that tapers toward the first direction D1.

The source select lines SSL1, SSL2, and SSL3 may overlap the drain select lines DSL1, DSL2, and DSL3 with the word lines WL interposed between the source select lines SSL1, SSL2, and SSL3 and the drain select lines DSL1, DSL2, and DSL3. In an embodiment, the source select lines SSL1, SSL2, and SSL3 may include the first source select line SSL1, the second source select line SSL2, and the third source select line SSL3 respectively extending parallel to the first drain select line DSL1, the second drain select line DSL2, and the third drain select line DSL3. The first source select line SSL1 may surround the first channel pillar CH1, the second source select line SSL2 may surround the second channel pillar CH2, and the third source select line SSL3 may surround the third channel pillar CH3.

The word lines WL may be penetrated by the dummy channel pillar DCH. The dummy channel pillar DCH may be disposed between the source isolation insulating layer SS and the drain isolation insulating layer SD. A sidewall of the dummy channel pillar DCH may be surrounded by a dummy memory pattern DML. The dummy channel pillar DCH may include a dummy core insulating layer DCO and a dummy channel layer DCL. The dummy core insulating layer DCO may be disposed in a central region of the dummy channel pillar DCH, and the dummy channel layer DCL may be disposed between the dummy core insulating layer DCO and the dummy memory pattern DML.

Conductive materials of the source select lines SSL1, SSL2, and SSL3 may be various. A manufacturing process of the semiconductor memory device may include a plurality of etching processes performed using various etching materials. The source select lines SSL1, SSL2, and SSL3 may include a material having an etching resistance to some of the etching materials. In an embodiment, each of the source select lines SSL1, SSL2, and SSL3 may include silicon.

The contact plug CT may pass through at least one insulating layer disposed between the bit line BL and the channel pillar CH. In an embodiment, a second insulating layer 133 and a third insulating layer 165 may be disposed between each of the gate stacks G1 and G2 and the bit line BL. The contact plug CT may be in contact with the capping pattern CAP and may extend toward the bit line BL to pass through the second insulating layer 133 and the third insulating layer 165.

The semiconductor memory device may include a first insulating structure 171, a first interconnection structure 173, and a first bonding metal pattern 175.

The first insulating structure 171 may be disposed between the peripheral circuit structure 50 and the bit line BL. The first insulating structure 171 may include two or more layers of insulating layers. The first interconnection structure 173 and the first bonding metal pattern 175 may be buried in the first insulating structure 171. The first interconnection structure 173 may include various shapes of conductive patterns. The first interconnection structure 173 may be disposed between the bit line BL and the first bonding metal pattern 175. The bit line BL may be electrically connected to the first bonding metal pattern 175 via the first interconnection structure 173. The first bonding metal pattern 175 may face the peripheral circuit structure 50.

The peripheral circuit structure 50 may include a substrate 101 including transistors TR, a second insulating structure 121, a second interconnection structure 123, and a second bonding metal pattern 125.

The transistors TR may be disposed in active regions of the substrate 101 partitioned by element isolation layers 103. Each of the transistors TR may include a gate insulating layer disposed on the active region, a gate electrode 115 disposed on the gate insulating layer 113, and junctions 111A and 111B formed in the active regions on both sides of the gate insulating layer 113. Some of the transistors TR may configure a page buffer circuit PB that controls a precharge operation and a discharge operation of the bit line BL. The page buffer circuit PB may be connected to the bit line BL via the second interconnection structure 123 and the first interconnection structure 173.

The second insulating structure 121 may be disposed between the first insulating structure 171 and the substrate 101. The second insulating structure 121 may include two or more layers of insulating layers. The second insulating structure 121 may be bonded to the first insulating structure 171. The second interconnection structure 123 and the second bonding metal pattern 125 may be buried in the second insulating structure 121. The second interconnection structure 123 may include various shapes of conductive patterns. The second interconnection structure 123 may be disposed between the transistors TR and the second bonding metal pattern 125. The transistor TR of the page buffer circuit PB may be electrically connected to the second bonding metal pattern 125 via the second interconnection structure 123. The second bonding metal pattern 125 may face the first bonding metal pattern 175 and may be bonded to the first bonding metal pattern 175.

Referring to FIG. 3B, the conductive pattern 23 may include a metal layer MT and a second metal barrier layer BM.

The channel pillar CH may protrude into the doped semiconductor layer 181 of the common source layer beyond the memory pattern ML. The channel layer CL of the channel pillar CH may extend between the doped semiconductor layer 181 and the core insulating layer CO.

The memory pattern ML may be disposed between the source select line SSL2 or SSL3 and the channel pillar CH. The memory pattern ML may extend between the channel pillar CH and each of the interlayer insulating layer 21, the conductive pattern 23, and the first insulating layer 11. The memory pattern ML may include a tunnel insulating layer TI, a data storage layer DL extending along an outer wall of the tunnel insulating layer TI, and a second blocking insulating layer BI extending along an outer wall of the data storage layer DL. The data storage layer DL may be formed of a material layer capable of storing data. In an embodiment, the data storage layer DL may be formed of a material layer capable of storing data that is changed using Fowler Nordheim tunneling. The material layer may include a nitride layer capable of trapping a charge. The second blocking insulating layer BI may include an oxide layer capable of blocking a charge. The tunnel insulating layer TI may be formed of a silicon oxide layer capable of charge tunneling.

The first blocking insulating layer 25 may include a material layer having a dielectric constant higher than that of the second blocking insulating layer BI. In an embodiment, the first blocking insulating layer may include an aluminum oxide layer. One of the first blocking insulating layer 25 and the second blocking insulating layer BI may be omitted.

The source isolation insulating layer SS may include a bottom surface facing the interlayer insulating layer 21 and an upper surface facing the doped semiconductor layer 181. A bottom surface width W11 of the source isolation insulating layer SS may be narrower than an upper surface width W12 of the source isolation insulating layer SS by the tapered shape according to an embodiment of the present disclosure.

Figure 4A:
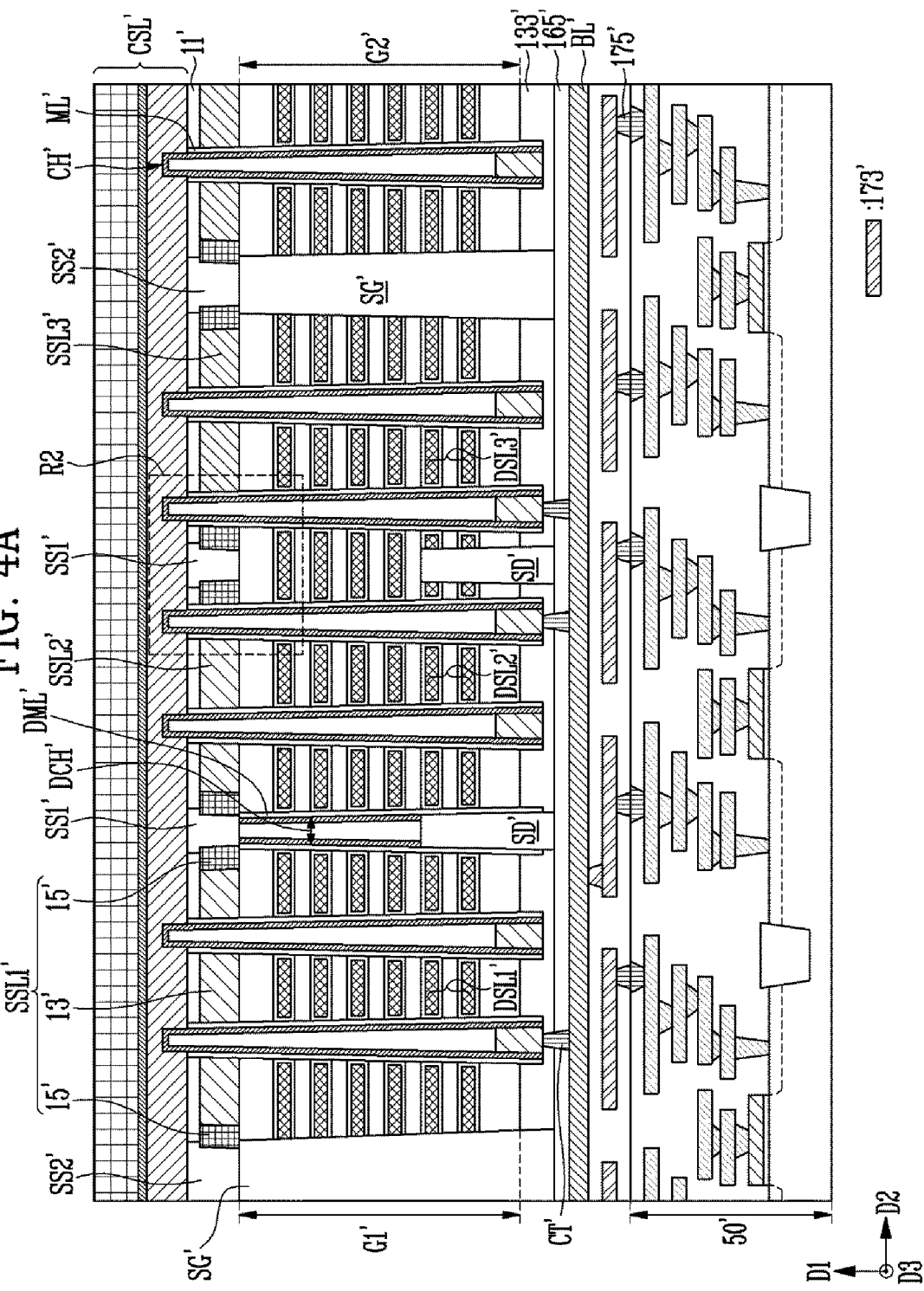
FIG. 4A is a cross-sectional view of a semiconductor memory device according to an embodiment of the present disclosure.
Figure 4B:
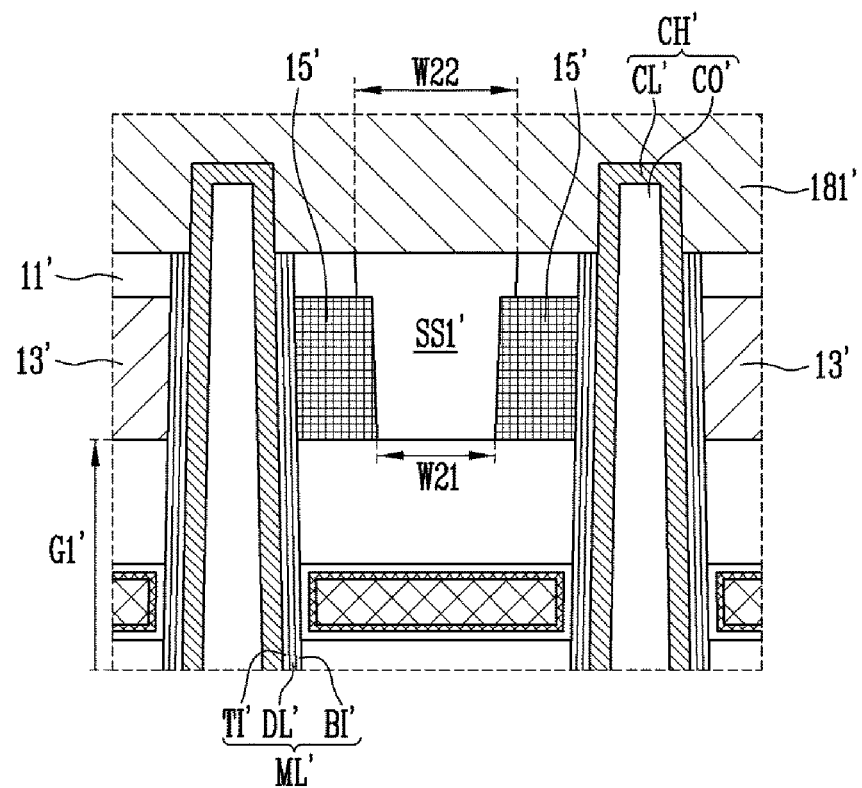
FIG. 4B is an enlarged cross-sectional view of a region R2 shown in FIG. 4A.

FIG. 4A is a cross-sectional view of a semiconductor memory device according to an embodiment of the present disclosure, and FIG. 4B is an enlarged cross-sectional view of a region R2 shown in FIG. 4A.

Referring to FIG. 4A, the semiconductor memory device may include a bit line BL' a common source layer CSL', gate stacks G1' and G2' a drain isolation insulating layer SD, and a contact plug CT' of the same structure as the bit line BL, the common source layer CSL, the gate stacks G1 and G2, the drain isolation insulating layer SD, and the contact plug CT shown in FIGS. 2 and 3A. Each of the gate stacks G1' and G2' may be penetrated by a channel pillar CH' and a dummy channel pillar DCH' as described with reference to FIG. 3A. The channel pillar CH' and the dummy channel pillar DCH' may extend in a first direction D1. A sidewall of the channel pillar CH' may be surrounded by a memory pattern ML, and a sidewall of the dummy channel pillar DCH' may be surrounded by a dummy memory pattern DML'.

In addition, the semiconductor memory device may include a peripheral circuit structure 50, a first interconnection structure 173, and a first bonding metal pattern 175' of the same structure as the peripheral circuit structure 50, the first interconnection structure 173, and the first bonding metal pattern 175 shown in FIG. 3A. In addition, the semiconductor memory device may include source select lines SSL1, SSL2', and SSL3' disposed between the gate stacks G1' and G2' and the common source layer CSL'.

Each of the source select lines SSL1', SSL2', and SSL3' may extend in a second direction D2 and a third direction D3 in a plane crossing the channel pillars CH'. The source select lines SSL1', SSL2', and SSL3' may be arranged to be spaced apart from each other in the second direction D2. The source select lines SSL1', SSL2', and SSL3' may be insulated from the common source layer CSL' by a first insulating layer 11'.

The source select lines SSL1', SSL2', and SSL3' may be separated from each other by first and second source isolation insulating layers SS1' and SS2'. Each of the first and second source isolation insulating layers SS1' and SS2' may include a first portion disposed between the source select lines SSL1', SSL2', and SSL3', and a second portion passing through the first insulating layer 11'. The first portion of each of the first and second source isolation insulating layers SS1' and SS2' may be formed in a tapered shape. The tapered shape of each of the first and second source isolation insulating layers SS1' and SS2' may be an inverse shape to a tapered shape of the channel pillar CH' as described with reference to FIG. 3A. Therefore, as described with reference to FIG. 3A, an embodiment of the present disclosure may improve an alignment margin of the first and second source isolation insulating layers SS1' and SS2'.

The first source isolation insulating layer SS1' may overlap the gate stack G1'. The first source isolation insulating layer SS1' may extend parallel to the drain isolation insulating layer SD'. In an embodiment, the first source isolation insulating layer SS1' and the drain isolation insulating layer SD' may extend in the third direction D3.

The second source isolation insulating layer SS2' may overlap a gate isolation insulating layer SG'. The second source isolation insulating layer SS2' may extend parallel to the gate isolation insulating layer SG'. In an embodiment, the second source isolation insulating layer SS2' and the gate isolation insulating layer SG' may extend in the third direction D3.

The source select lines SSL1', SSL2', and SSL3' may overlap drain select lines DSL1', DSL2', and DSL3' of the gate stack G1'. In an embodiment, each of the source select lines SSL1, SSL2, and SSL3' may include a silicon layer 13' and a metal silicide layer 15'. The silicon layer 13' may serve as an etch stop layer during the manufacturing process of the semiconductor memory device. The metal silicide layer 15' may be disposed between each of the first and second source isolation insulating layers SS1' and SS2' and the silicon layer 13'. The metal silicide layer 15' may be in contact with the silicon layer 13'. The metal silicide layer 15' may reduce a resistance of the source select lines SSL1, SSL2, and SSL3'.

A second insulating layer 133' and a third insulating layer 165' may be formed in the same structure as the second insulating layer 133 and the third insulating layer 165 shown in FIG. 3A.

Referring to FIG. 4B, the channel pillar CH' may protrude into a doped semiconductor layer 181' of the common source layer beyond a memory pattern ML' as described with reference to FIG. 3B. A channel layer CL' and a core insulating layer CO' of the channel pillar CH' may extend into the doped semiconductor layer 181'.

The memory pattern ML' may include a tunnel insulating layer TI', a data storage layer DL, and a blocking insulating layer BI' as described with reference to FIG. 3B.

The first source isolation insulating layer SS1' may include a bottom surface facing the gate stack G1' and an upper surface facing the doped semiconductor layer 181'. A bottom surface width W21 of the first source isolation insulating layer SS1' may be narrower than an upper surface width W22' of the first source isolation insulating layer SS1' by the tapered shape according to an embodiment of the present disclosure.

Figure 5:
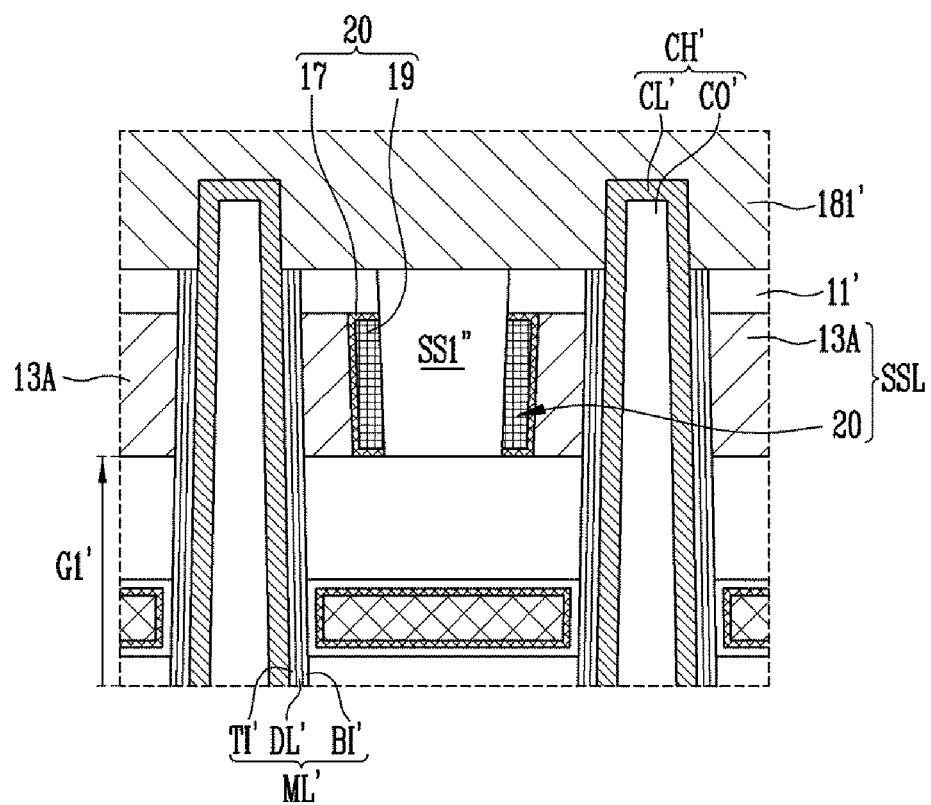
FIG. 5 is an enlarged cross-sectional view of source select lines of a semiconductor memory device according to an embodiment of the present disclosure.

FIG. 5 is an enlarged cross-sectional view of source select lines SSL of a semiconductor memory device according to an embodiment of the present disclosure.

Referring to FIG. 5, the gate stack G1', the first insulating layer 11', the memory pattern ML', the tunnel insulating layer TI', the data storage layer DL', the blocking insulating layer BI', the channel pillar CH', the core insulating layer CO', the channel layer CL', and the doped semiconductor layer 181' of the common source layer may be formed in a structure described with reference to FIGS. 4A and 4B.

The source select lines SSL may be separated from each other by a source isolation insulating layer SS1" overlapping the gate stack G1'. Each of the source select lines SSL may include a silicon layer 13A and a sidewall conductive pattern 20. As described with reference to FIG. 4A, the silicon layer 13A may serve as an etch stop layer during the manufacturing process of the semiconductor memory device. The sidewall conductive pattern 20 may be disposed between the source isolation insulating layer SS1" and the silicon layer 13A. The sidewall conductive pattern 20 may include a metal barrier layer 17 that is in contact with the silicon layer 13A and a metal layer 19 disposed between the metal barrier layer 17 and the source isolation insulating layer SS1". The metal layer 19 may reduce a resistance of the source select lines SSL. The metal barrier layer 17 may extend between the metal layer 19 and the first insulating layer 11'. The metal barrier layer 17 may extend between the metal layer 19 and the gate stack G1'.

Figure 6A:
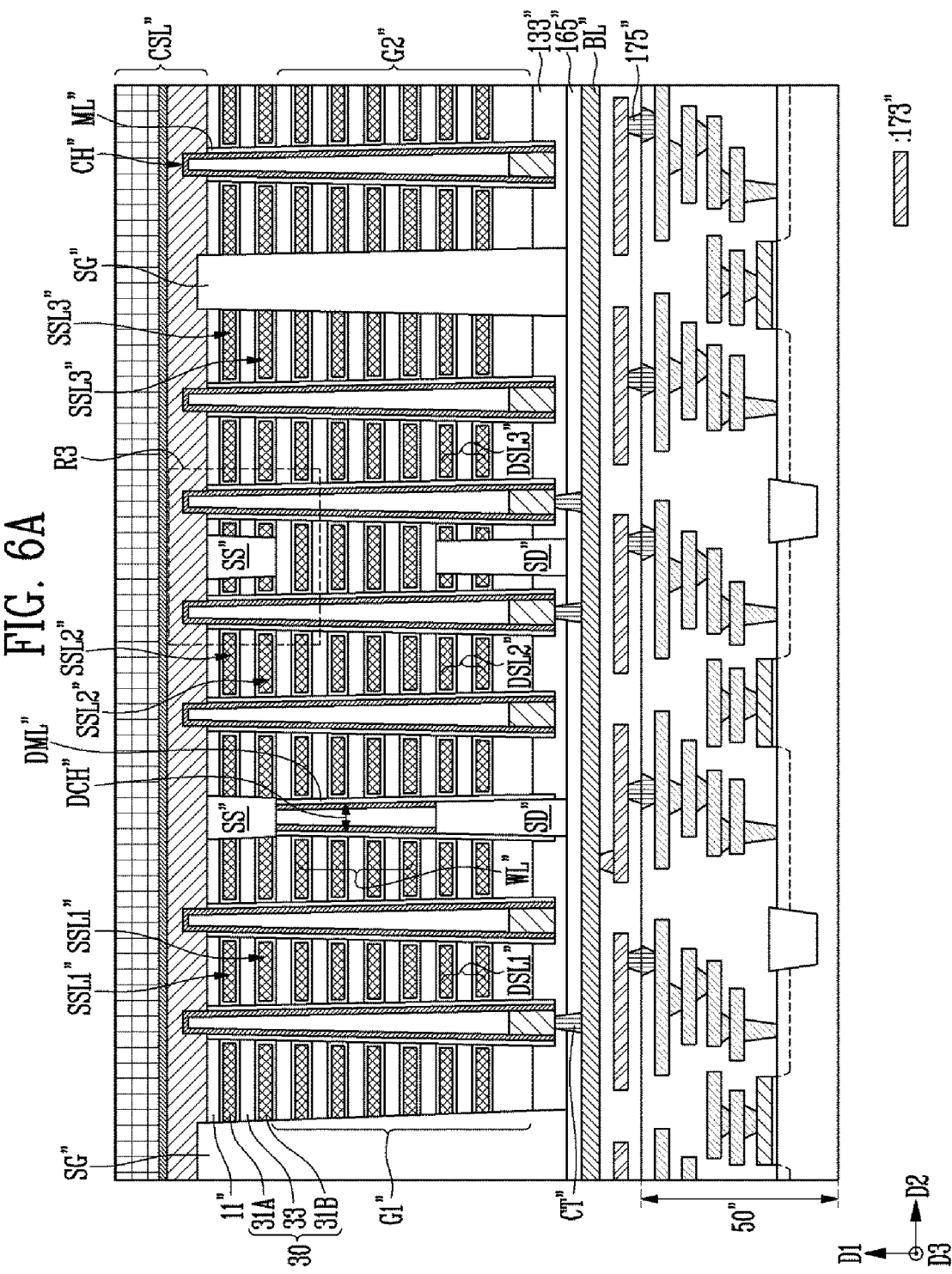
FIG. 6A is a cross-sectional view of a semiconductor memory device according to an embodiment of the present disclosure.
Figure 6B:
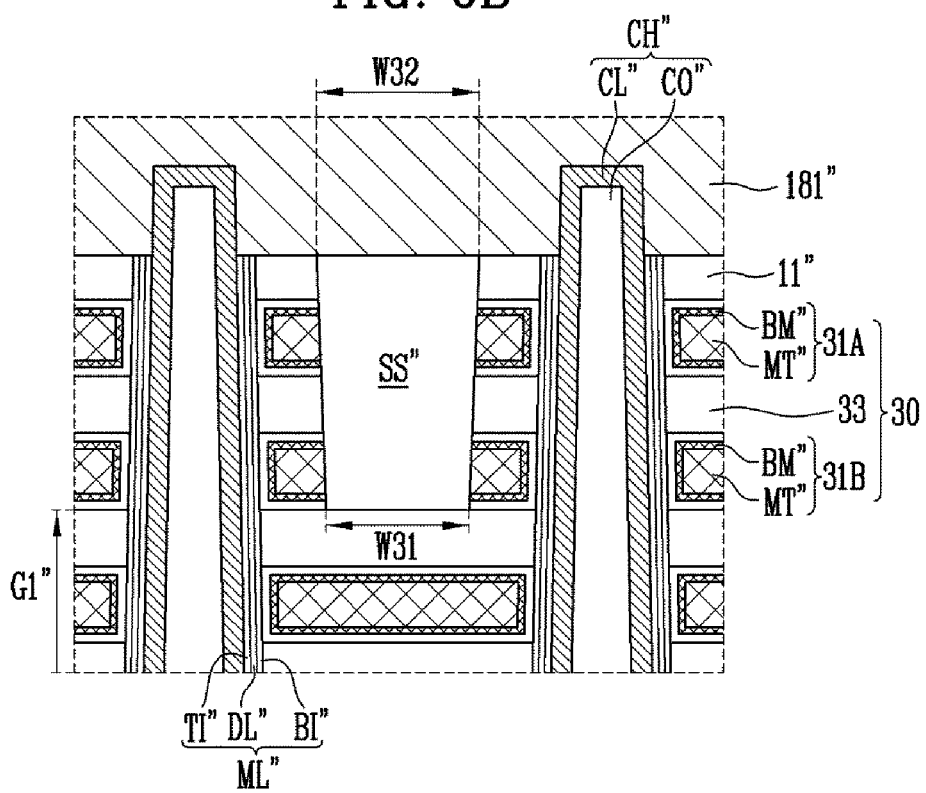
FIG. 6B is an enlarged cross-sectional view of a region R3 shown in FIG. 6A.

FIG. 6A is a cross-sectional view of a semiconductor memory device according to an embodiment of the present disclosure, and FIG. 6B is an enlarged cross-sectional view of a region R3 shown in FIG. 6A.

Referring to FIG. 6A, the semiconductor memory device may include a bit line BL", a common source layer CSL, gate stacks G1" and G2", a drain isolation insulating layer SD", and a contact plug CT" of the same structure as the bit line BL, the common source layer CSL, the gate stacks G1 and G2, the drain isolation insulating layer SD, and the contact plug CT shown in FIGS. 2 and 3A. Each of the gate stacks G1" and G2" may be penetrated by a channel pillar CH" and a dummy channel pillar DCH" as described with reference to FIG. 3A. A sidewall of the channel pillar CH" may be surrounded by a memory pattern ML", and a sidewall of the dummy channel pillar DCH" may be surrounded by a dummy memory pattern DML".

In addition, the semiconductor memory device may include a peripheral circuit structure 50", a first interconnection structure 173", and a first bonding metal pattern 175" of the same structure as the peripheral circuit structure 50, the first interconnection structure 173, and the first bonding metal pattern 175 shown in FIG. 3A. In addition, the semiconductor memory device may include source select lines SSL1", SSL2", and SSL3" disposed between the gate stacks G1" and G2" and the common source layer CSL".

Each of the source select lines SSL1", SSL2", and SSL3" may extend in the second direction D2 and the third direction D3 in a plane crossing the first direction D1, which is an extension direction of the channel pillar CH". The source select lines SSL1", SSL2", and SSL3" may include the same conductive material as word lines WL" of the gate stack G1". The source select lines SSL1", SSL2", and SSL3" may overlap drain select lines DSL1", DSL2", and DSL3". The source select lines SSL1", SSL2', and SSL3" may be disposed on two or more layers spaced apart from each other in the first direction D1.

In an embodiment, the source select lines SSL1", SSL2", and SSL3" may be formed of a select stack 30 disposed between the word lines WL" and a first insulating layer 11". The select stack 30 may include a first conductive pattern 31A, an interlayer insulating layer 33, and a second conductive pattern 31B. The first conductive pattern 31A may be disposed between the interlayer insulating layer 33 and the first insulating layer 11", and the second conductive pattern 31B may be disposed between the interlayer insulating layer 33 and the gate stack G1".

The select stack 30 may be penetrated by a source isolation insulating layer SS" and a gate isolation insulating layer SG". Each of the first conductive pattern 31A and the second conductive pattern 31B may be separated into the source select lines SSL1", SSL2", and SSL3" by the source isolation insulating layer SS". In an embodiment, the source select lines SSL1", SSL2", and SSL3" may include the first source select line SSL1" of two layers, the second source select line SSL2" of two layers, and the third source select line SSL3" of two layers. The first to third source select lines SSL1" to SSL3" of the two layers may be configured of the first conductive pattern 31A and the second conductive pattern 31B.

The source isolation insulating layer SS" may be formed in a shape inverse to a tapered shape of the channel pillar CH" as described with reference to FIG. 3A. Therefore, as described with reference to FIG. 3A, an embodiment of the present disclosure may improve an alignment margin of the source isolation insulating layer SS".

The source isolation insulating layer SS" may overlap the gate stack G1". The source isolation insulating layer SS" may extend parallel to a drain isolation insulating layer SD". In an embodiment, the source isolation insulating layer SS" and the drain isolation insulating layer SD" may extend in the third direction D3.

A second insulating layer 133" and a third insulating layer 165" may be formed in the same structure as the second insulating layer 133 and the third insulating layer 165 shown in FIG. 3A.

Referring to FIG. 6B, each of the first conductive pattern 31A and the second conductive pattern 31B of the select stack 30 may include a metal layer MT" and a metal barrier layer BM". The metal barrier layer BM" may be disposed between the metal layer MT" and a memory pattern ML". The metal barrier layer BM" may extend between the metal layer MT" and the first insulating layer 11". The metal barrier layer BM" may extend between the metal layer MT" and the interlayer insulating layer 33. The metal barrier layer BM" may extend between the metal layer MT" and the gate stack G1".

The memory pattern ML" may include a tunnel insulating layer TI", a data storage layer DL", and a blocking insulating layer BI" as described with reference to FIG. 3B. The channel pillar CH" may protrude into a doped semiconductor layer 181" of the common source layer beyond the memory pattern ML" as described with reference to FIG. 3B. A channel layer CL" and a core insulating layer CO" of the channel pillar CH" may extend into the doped semiconductor layer 181".

The source isolation insulating layer SS" may include a bottom surface facing the gate stack G1" and an upper surface facing the doped semiconductor layer 181". A bottom surface width W31 of the source isolation insulating layer SS" may be narrower than an upper surface width W32 of the source isolation insulating layer SS" by the tapered shape according to an embodiment of the present disclosure.

FIGS. 7A to 7H are cross-sectional views illustrating a method of manufacturing a semiconductor memory device according to an embodiment of the present disclosure.

Figure 7A:
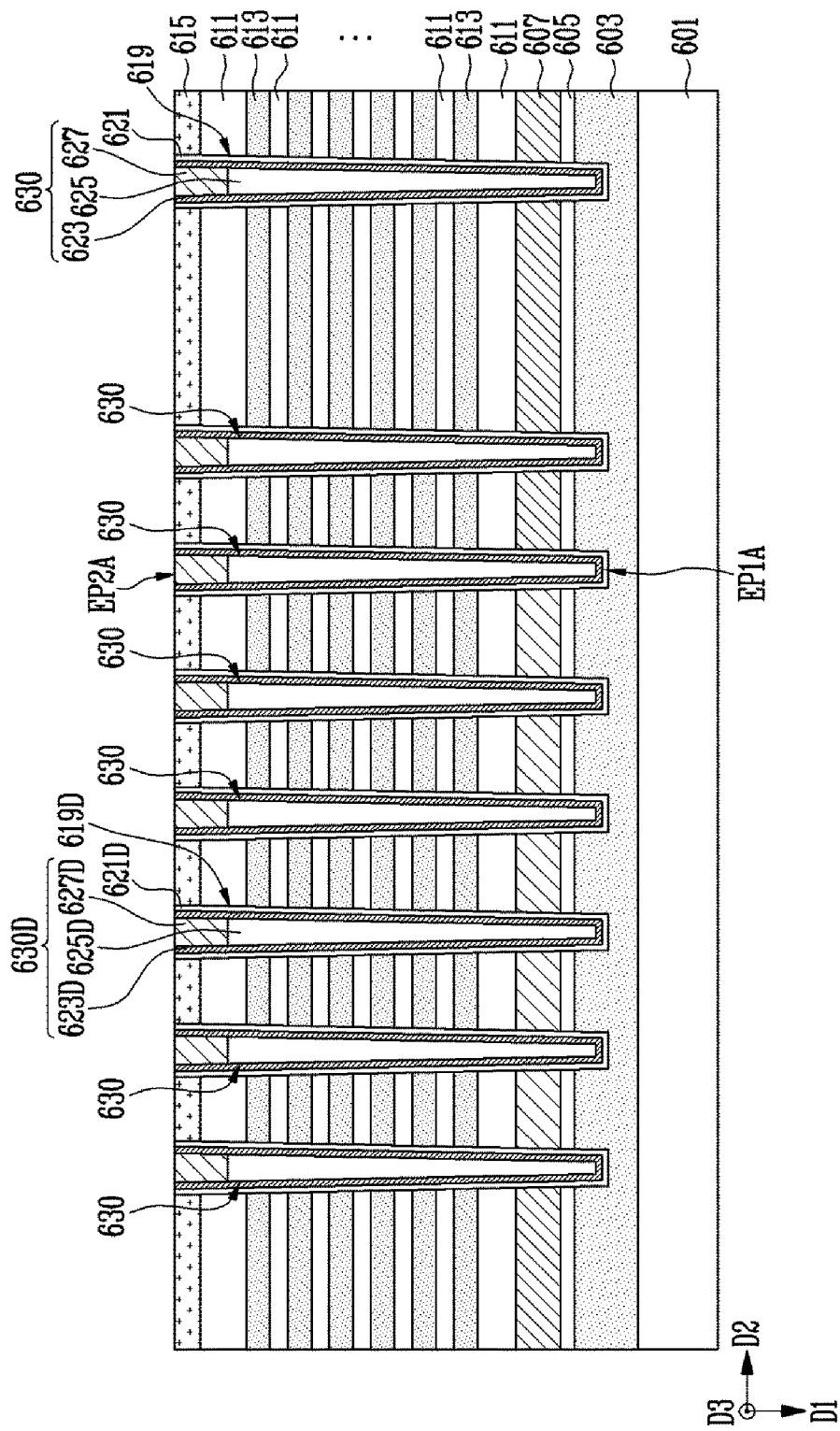

Referring to FIG. 7A, a protective layer 603 may be formed on a sacrificial substrate 601. The protective layer 603 may include a material having an etch selectivity for the sacrificial substrate 601. In an embodiment, the sacrificial substrate 601 may be a silicon substrate, and the protective layer 603 may include a silicon nitride layer.

Subsequently, a first insulating layer 605 and a first conductive pattern 607 may be stacked on the protective layer 603. Thereafter, interlayer insulating layers 611 and sacrificial layers 613 may be alternately stacked on the first conductive pattern 607.

The first insulating layer 605 may include a silicon oxide layer. The first conductive pattern 607 may include a conductive material having an etch selectivity for the interlayer insulating layers 611 and the sacrificial layers 613. In an embodiment, the first conductive pattern 607 may include a silicon layer, the interlayer insulating layers 611 may include a silicon oxide layer, and the sacrificial layers 613 may include a silicon nitride layer.

Thereafter, a first mask pattern 615 may be formed on the stack of the interlayer insulating layers 611 and the sacrificial layers 613. Subsequently, channel holes 619 passing through the interlayer insulating layers 611 and the sacrificial layers 613 and extending into the protective layer 603 may be formed. A dummy hole 619D of the same shape as each of the channel holes 619 may be formed by using a process of forming the channel holes 619.

Each of the channel holes 619 and the dummy hole 619D may be formed by etching the interlayer insulating layers 611, the sacrificial layers 613, the first conductive pattern 607, and the first insulating layer 605 with an etching process using the first mask pattern 615 as an etching barrier. During the etching process for forming the channel holes 619 and the dummy hole 619D, a portion of the protective layer 603 may be etched, but the protective layer 603 may remain along a bottom surface of each of the channel holes 619 and the dummy hole 619D.

The etching process for forming the channel holes 619 and the dummy hole 619D may be performed by sequentially etching the interlayer insulating layers 611, the sacrificial layers 613, the first conductive pattern 607, and the first insulating layer 605 from the interlayer insulating layer 611 adjacent to the first mask pattern 615 toward the protective layer 603. Accordingly, each of the channel holes 619 and the dummy hole 619D may have a tapered shape that tapers in the first direction D1 toward the sacrificial substrate 601.

Subsequently, memory layers 621 and a dummy memory layer 621D may be formed on surfaces of the channel holes 619 and the dummy hole 619D, respectively. Each of the memory layers 621 and the dummy memory layer 621D may include a first blocking insulating layer 621A, a data storage layer 621B, and a tunnel insulating layer 621C shown in FIG. 8A.

Thereafter, channel pillars 630 may be formed in central regions of the channel holes 619 opened by the memory layers 621. While forming the channel pillars 630, a dummy channel pillar 630D may be formed in a center region of the dummy hole 619D opened by the dummy memory layer 621D.

Forming the channel pillars 630 and the dummy channel pillar 630D may include forming a semiconductor layer along the surfaces of each of the channel holes 619 and the dummy channel hole 619D, forming a filling insulating layer on the semiconductor layer, removing a portion of the filling insulating layer, filling a region from which the filling insulating layer is removed with a doped semiconductor layer, and planarizing the doped semiconductor layer and the semiconductor layer so that the first mask pattern 615 is exposed. The filling insulating layer may remain as core insulating layers 625 inside the channel holes 619 and may remain as dummy core insulating layer 625D inside the dummy channel hole 619D by the above-described series of processes. In addition, the semiconductor layer may remain as channel layers 623 inside the channel holes 619 and may remain as dummy channel layer 623D inside the dummy channel hole 619D. In addition, the doped semiconductor layer may remain as capping patterns 627 inside the channel holes 619 and may remain as a dummy capping pattern 627D inside the dummy channel hole 619D. The semiconductor layer may include a silicon layer, and the doped semiconductor layer may include a doped silicon layer including an n-type impurity.

Each of the channel pillars 630 may include a first end EP1A facing the first direction D1 and a second end EP2A facing a direction opposite to the first end EP1A. Each of the channel pillars 630 may have a tapered shape that tapers as the channel pillar 630 approaches the first end EP1A.

After the channel pillars 630 and the dummy channel pillars 630D are formed, the first mask pattern 615 may be removed.

Figure 7B:
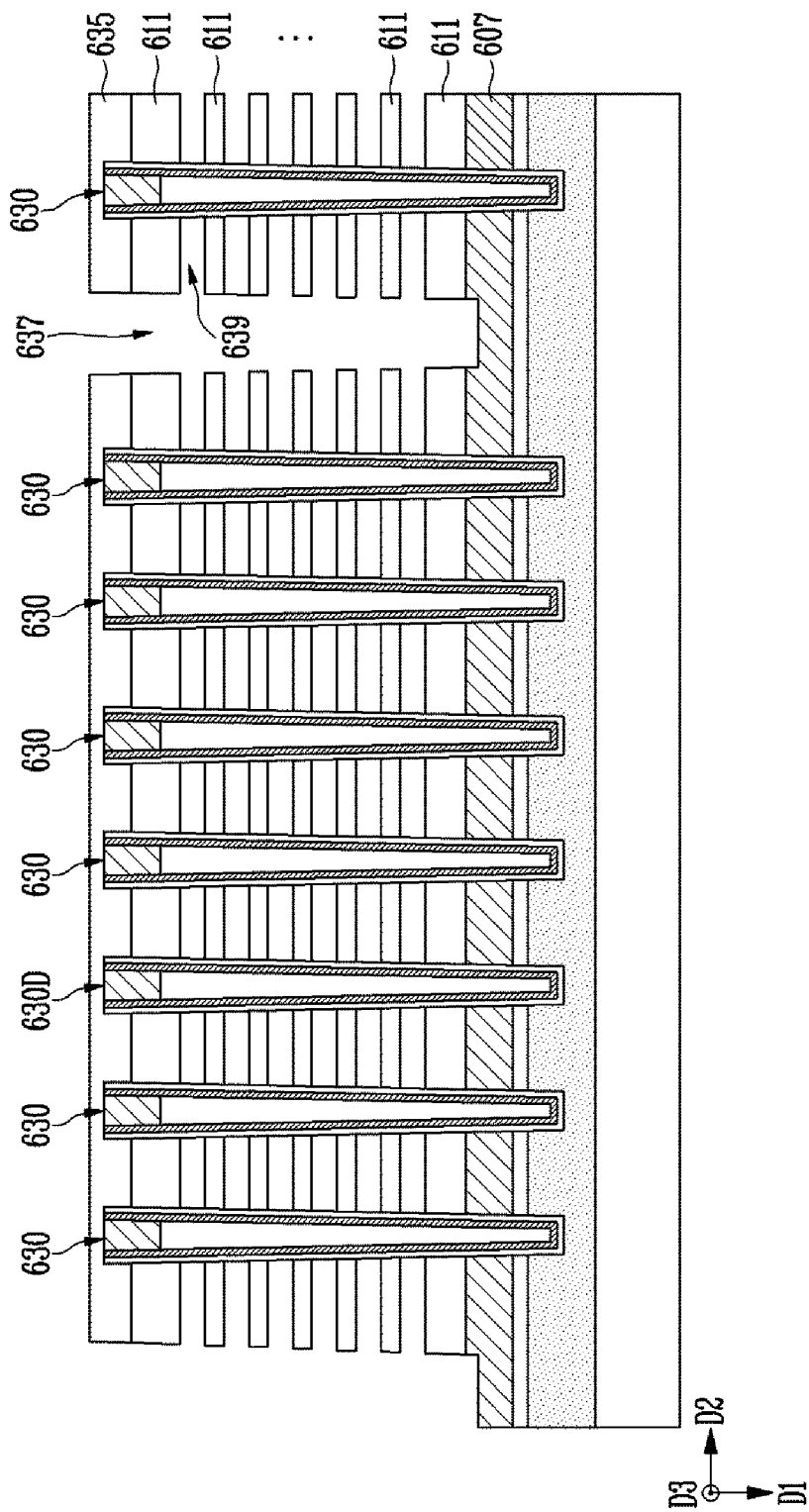

Referring to FIG. 7B, a second insulating layer 635 covering the channel pillars 630 and the dummy channel pillar 630D may be formed. The second insulating layer 635 may extend to overlap the interlayer insulating layers 611.

Subsequently, a first slit 637 may be formed to pass through the second insulating layer 635, the interlayer insulating layers 611, and the sacrificial layers 613 shown in FIG. 7A. During an etching process for forming the first slit 637, the first conductive pattern 607 may serve as an etch stop layer.

Thereafter, horizontal spaces 639 may be opened between the interlayer insulating layers 611 by selectively removing the sacrificial layers 613 through the first slit 637.

Referring to FIG. 7C, second conductive patterns 649 may be formed inside the horizontal spaces 639 shown in FIG. 7B through the first slit 637, respectively. Before forming the second conductive patterns 649, a second blocking insulating layer 641 may be formed on a surface of each of the horizontal spaces 639.

Figure 8A:
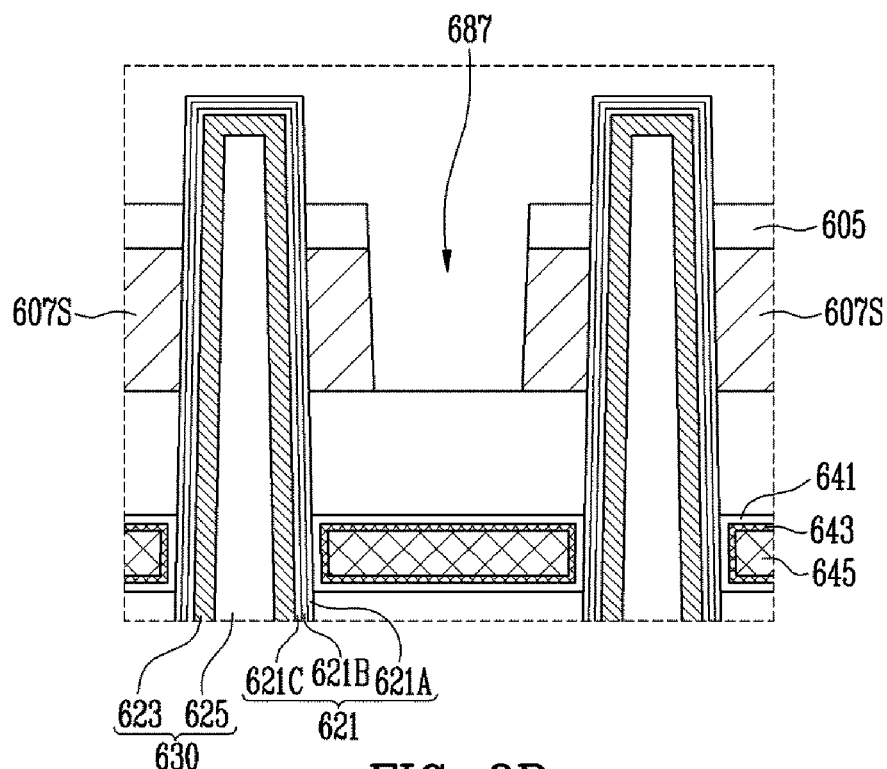
FIGS. 8A to 8D are enlarged cross-sectional views illustrating subsequent processes after a process shown in FIG. 7H.

Forming the second conductive patterns 649 may include filling the horizontal spaces 639 opened by the second blocking insulating layer 641 with a conductive material, and removing the conductive material inside the first slit 637 so that the conductive material may be separated into the second conductive patterns 649. The conductive material of the second conductive patterns 649 may include a metal barrier layer 643 and a metal layer 645 as shown in FIG. 8A.

A preliminary structure 650 may be defined through the processes described above with reference to FIGS. 7A to 7C. The preliminary structure 650 may include the channel pillars 630 having the tapered shape, the first conductive pattern 607 surrounding the channel pillars 630, and the interlayer insulating layers 611 and the second conductive patterns 649 alternately stacked on the first conductive pattern 607 and surrounding the channel pillars 630.

Thereafter, a second slit 651 may be formed by etching the first conductive pattern 607 exposed through the first slit 637. The second slit 651 may pass through the first conductive pattern 607 and may be connected to the first slit 637.

Figure 7D:
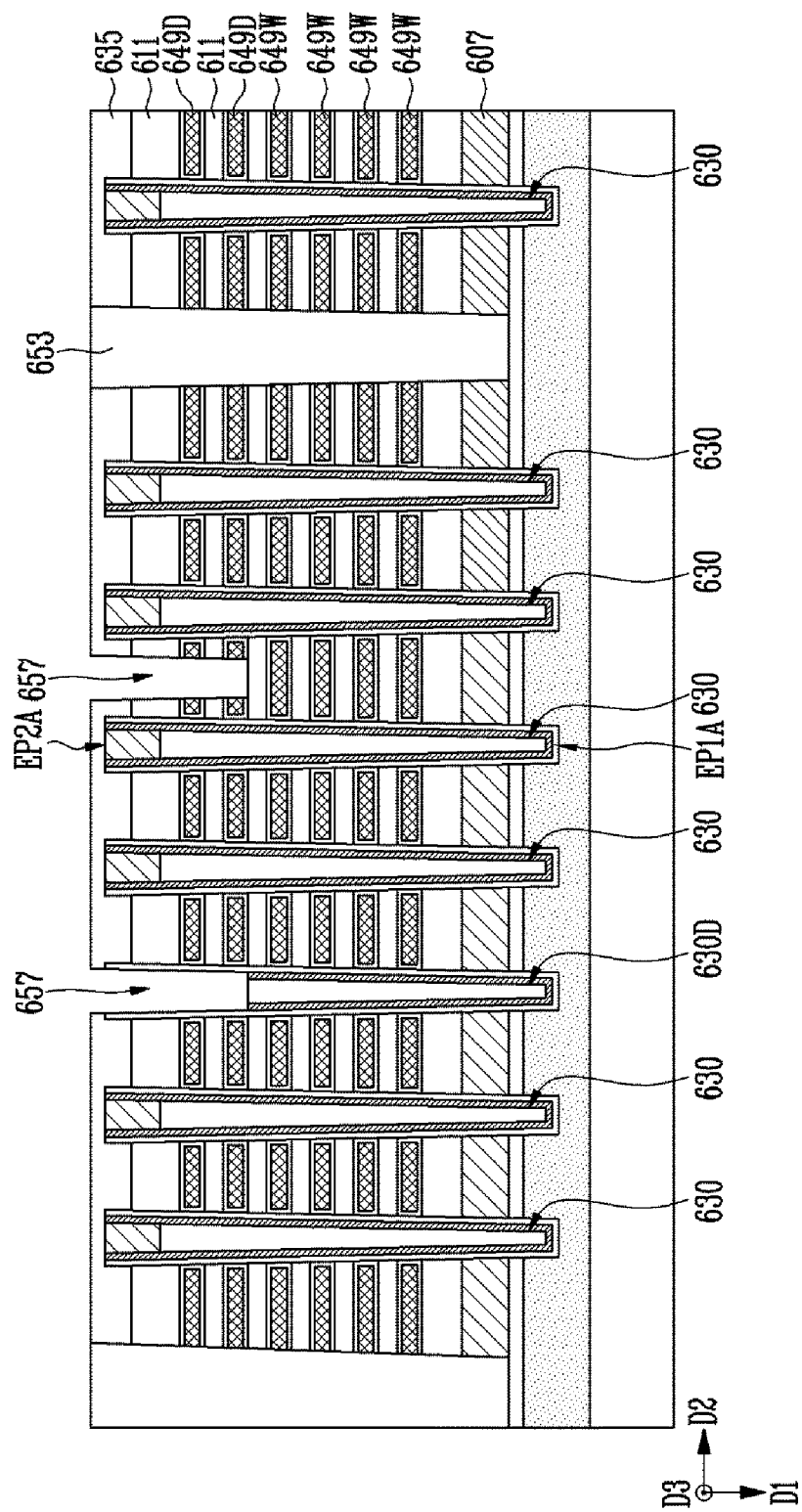

Referring to FIG. 7D, the first slit 637 and the second slit 651 shown in FIG. 7C may be filled with a gate isolation insulating layer 653. Thereafter, a drain trench 657 may be formed. The drain trench 657 may pass through at least one layer among the second conductive patterns 649 shown in FIG. 7C. The second conductive pattern 649 penetrated by the drain trench 657 is adjacent to the second end EP2A of the channel pillar 630.

The drain trench 657 may extend in the third direction D3 between the channel pillars 630. The second conductive pattern 649 shown in FIG. 7C may be separated into drain select lines 649D by the drain trench 657. The drain select lines 649D may extend in the second direction D2 and the third direction D3 in a plane crossing the channel pillars 630 to surround the channel pillars 630.

During an etching process for forming the drain trench 657, a portion of the dummy channel pillar 630D may be etched. The etching process for forming the drain trench 657 may be performed by sequentially etching the second insulating layer 635, the interlayer insulating layer 611, and at least one layer among the second conductive patterns 649 shown in FIG. 7C from the second insulating layer 635 toward the second conductive patterns 649 shown in FIG. 7C. Accordingly, the drain trench 657 may have a tapered shape that tapers toward the first direction D1.

Some of the second conductive patterns 649 shown in FIG. 7C may be defined as word lines 649W. The word lines 649W might not be penetrated by the drain trench 657 and may be disposed between the drain select line 649D and the first conductive pattern 607.

Some regions of the drain trench 657 may overlap the dummy channel pillar 630D, and other regions may overlap some regions of the word line 649W, which is not penetrated by the dummy channel pillar 630D. Although not shown in the drawing, the dummy channel pillar 630D shown in FIG. 7D may be adjacent to another dummy channel pillar in the third direction D3. The some region of the word line 649W overlapping the drain trench 657 may be disposed between dummy channel pillars adjacent in the third direction D3. An arrangement of the dummy channel pillars and the drain trench 657 is the same as the arrangement of the dummy channel pillars DCH and the drain isolation insulating layer SD shown in FIG. 2.

Figure 7E:
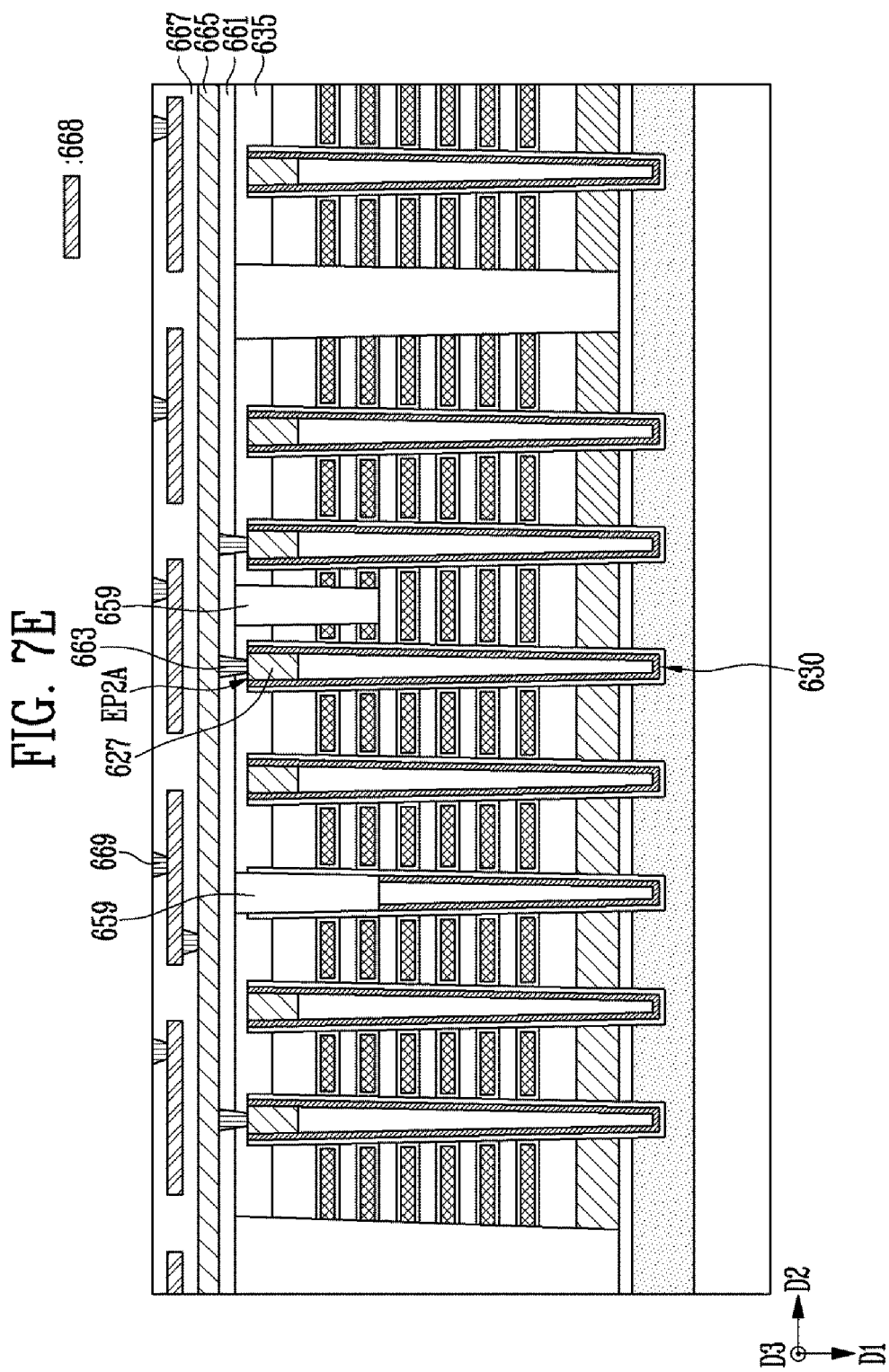

Referring to FIG. 7E, the drain trench 657 shown in FIG. 7D may be filled with a drain isolation insulating layer 659. The drain isolation insulating layer 659 may have the same tapered shape as the drain trench 657 shown in FIG. 7D.

According to an embodiment of the present disclosure, the drain isolation insulating layer 659 is formed after replacing the sacrificial layers 613 shown in FIG. 7A with the second conductive patterns 649 shown in FIG. 7C. Accordingly, a problem that inflow of an etching material or a conductive material is blocked does not occur by the drain isolation insulating layer 659 when a process for replacing the sacrificial layers 613 shown in FIG. 7A with the second conductive patterns 649 shown in FIG. 7C is performed. Therefore, according to an embodiment of the present disclosure, because a layout of the drain isolation insulating layer 659 may be designed without a design restriction for the inflow of the etching material or the conductive material, design freedom for the drain isolation insulating layer 659 may be improved.

Subsequently, a third insulating layer 661 may be formed on the second insulating layer 635. Thereafter, a contact plug 663 may be formed to pass through the second insulating layer 635 and the third insulating layer 661 overlapping the channel pillar 630. The contact plug 663 may be in contact with the capping pattern 627 of the channel pillar 630.

Subsequently, a bit line 665 may be formed. The bit line 665 may face the second end EP2A of each of the channel pillars 630. The bit line 665 may be formed on the third insulating layer 661 and may be in contact with the contact plug 663. The bit line 665 may extend in a direction crossing the drain isolation insulating layer 659. In the present embodiment, the bit line 665 may extend in the second direction D2.

After the bit line 665 is formed, a first interconnection structure 668 and first bonding metal patterns 669 may be formed. The first interconnection structure 668 and the first bonding metal patterns 669 may be buried in a first insulating structure 667. The first interconnection structure 668 may include various shapes of conductive patterns. The first bonding metal patterns 669 may be connected to the first interconnection structure 668. At least one of the first bonding metal patterns 669 may overlap the bit line 665 and may be connected to the bit line 665 via the first interconnection structure 668.

Figure 7F:
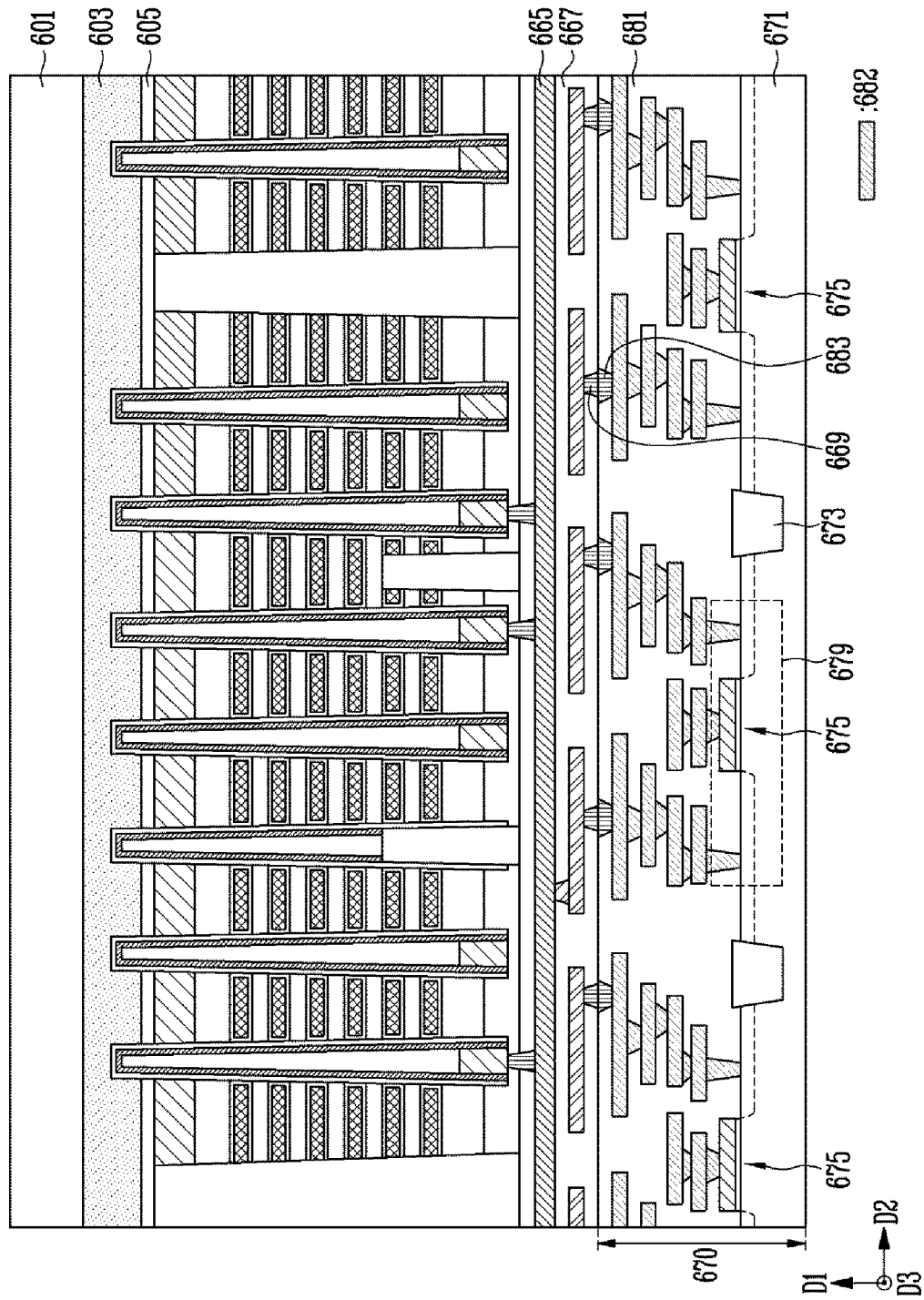

Referring to FIG. 7F, a peripheral circuit structure 670 may be provided. The peripheral circuit structure 670 may include a substrate 671 including transistors 675, a second insulating structure 681 covering the substrate 671, and a second interconnection structure 682 and a second bonding metal pattern 683 buried in the second insulating structure 681.

The substrate 671 may be a semiconductor substrate such as a silicon substrate or a germanium substrate. The transistors 675 may be formed in an active region of the substrate 671 partitioned by element isolation layers 673. Each of the transistors 675 may be configured to the same as the transistor TR described with reference to FIG. 3A. Some of the transistors 675 may be included in a page buffer circuit 679.

The second interconnection structure 682 may include various shapes of conductive patterns. The second bonding metal patterns 683 may be connected to the second interconnection structure 682. At least one of the second bonding metal patterns 683 may overlap the page buffer circuit 679 and may be connected to the page buffer circuit 679 via the second interconnection structure 682.

A sacrificial substrate 601 may be aligned with the peripheral circuit structure 670 so that the first bonding metal patterns 669 face the second bonding metal patterns 683 of the peripheral circuit structure 670. Thereafter, the first bonding metal patterns 669 and the second bonding metal patterns 683 may be bonded to each other.

Figure 7G:
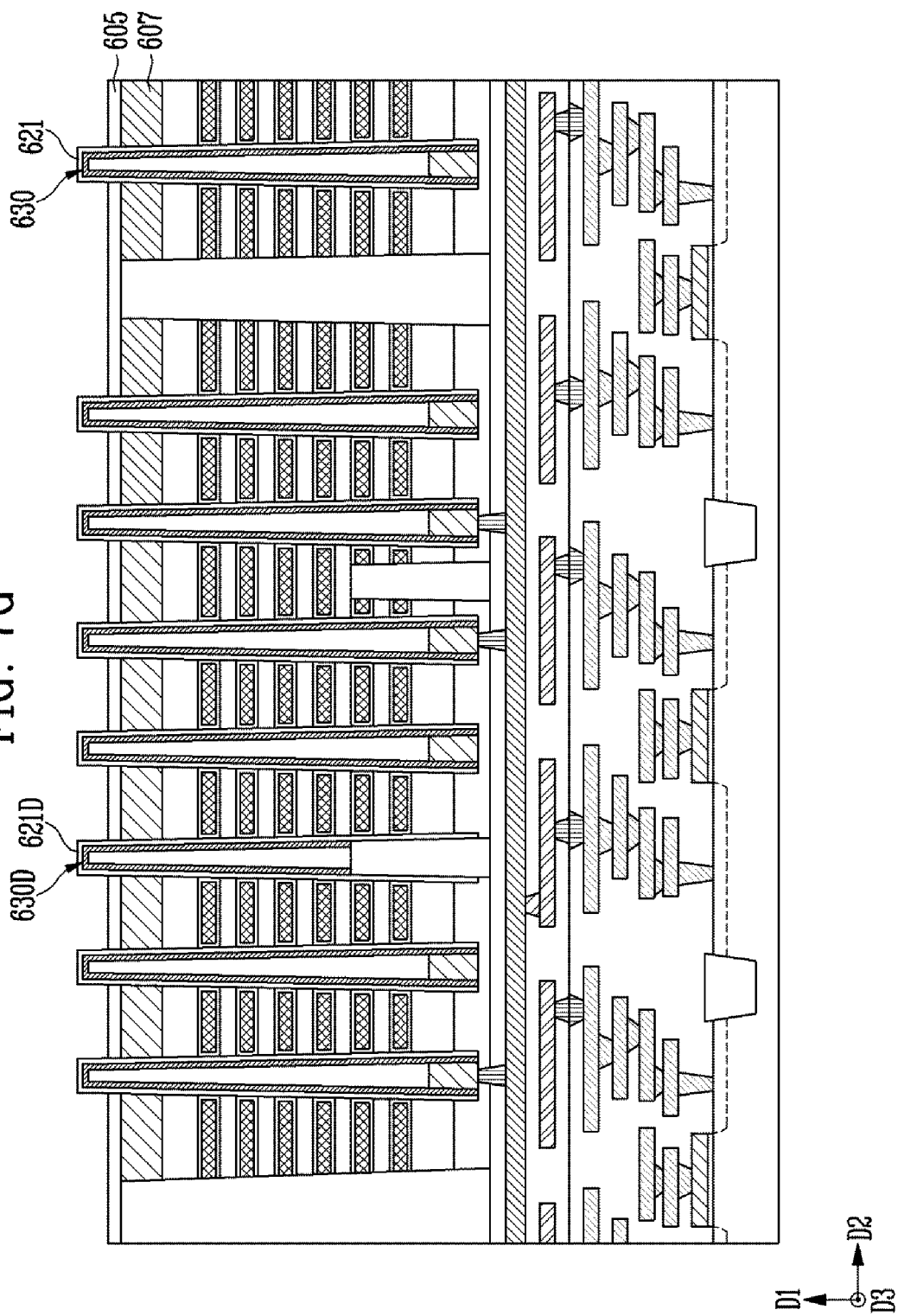

Referring to FIG. 7G, the sacrificial substrate 601 shown in FIG. 7F may be removed. While the sacrificial substrate 601 is removed, the protective layer 603 shown in FIG. 7F may protect the channel pillars 630 and the memory layer 621. Subsequently, the first insulating layer 605 may be exposed by selectively removing the protective layer 603 shown in FIG. 7F.

The memory layer 621 may remain to cover the surface of each of the channel pillars 630 protruding in the first direction D1 beyond the first insulating layer 605, and the dummy memory layer 621D may remain to cover the surface of the dummy channel pillar 630D protruding in the first direction D1 beyond the first insulating layer 605.

Referring to FIG. 7H, a second mask pattern 685 may be formed on the first insulating layer 605. Subsequently, a source trench 687 passing through the first insulating layer 605 shown in FIG. 7G and the first conductive pattern 607 shown in FIG. 7G may be formed through an etching process using the second mask pattern 685 as an etching barrier. Accordingly, the first conductive pattern 607 shown in FIG. 7G may be separated into source select lines 607S by the source trench 687.

The source select lines 607S may extend in the second direction D2 and the third direction D3 to surround the channel pillars 630. The source trench 687 may extend in the third direction D3 between the channel pillars 630. The source trench 687 may overlap the drain isolation insulating layer 659 with the word lines 649W interposed between the source trench 687 and the drain isolation insulating layer 659. The source trench 687 may overlap the dummy channel pillar 630D. During an etching process for forming the source trench 687, a portion of the dummy memory layer 621D and a portion of the dummy channel pillar 630D may be etched.

The etching process for forming the source trench 687 may be performed by sequentially etching the first insulating layer 605 shown in FIG. 7G and the first conductive pattern 607 shown in FIG. 7G toward the direction opposite to the first direction D1. Accordingly, the source trench 687 may have a tapered shape that tapers toward the direction opposite to the first direction D1.

FIGS. 8A to 8D are enlarged cross-sectional views illustrating subsequent processes after the process shown in FIG. 7H. FIGS. 8A to 8D are enlarged cross-sectional views of a region RA shown in FIG. 7H.

Referring to FIG. 8A, the first insulating layer 605 and the memory layer 621 may be exposed by removing the second mask pattern 685 shown in FIG. 7H. The memory layer 621 may include the first blocking insulating layer 621A, the data storage layer 621B, and the tunnel insulating layer 621C. The first blocking insulating layer 621A may include a silicon oxide layer, the data storage layer 621B may include a silicon nitride layer, and the tunnel insulating layer 621C may include a silicon oxide layer. The second blocking insulating layer 641 may include a material layer having a dielectric constant higher than that of the first blocking insulating layer 621A. In an embodiment, the second blocking insulating layer 641 may include an aluminum oxide layer.

Figure 8B:
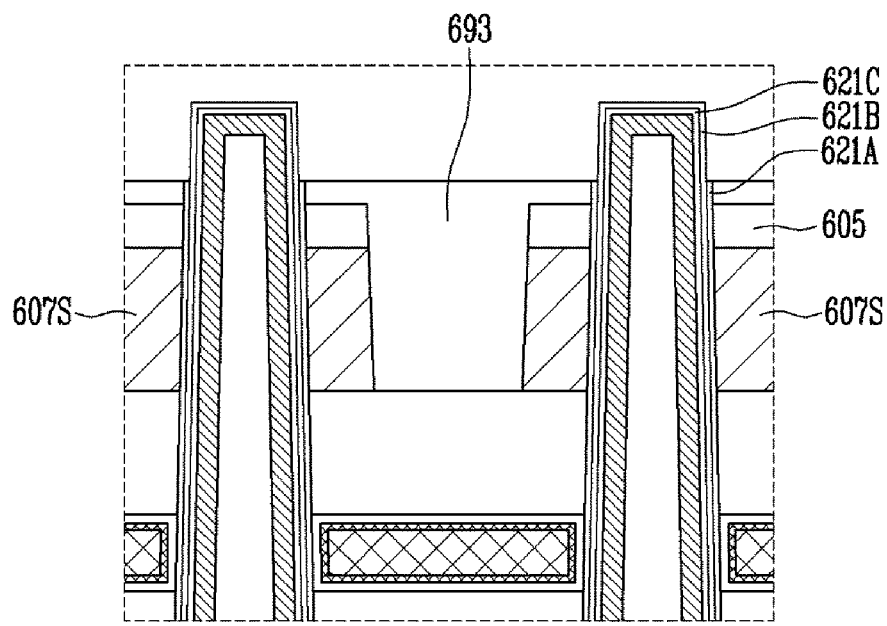

Referring to FIG. 8B, the source trench 687 shown in FIG. 8A may be filled with a source isolation insulating layer 693. The source isolation insulating layer 693 may include an oxide layer.

Subsequently, a portion of the first blocking insulating layer 621A may be removed so that the data storage layer 621B is exposed. At this time, a portion of the source isolation insulating layer 693 may be removed. The portion of the first blocking insulating layer 621A and the portion of the source isolation insulating layer 693 may be removed using an etch-back process.

Figure 8C:
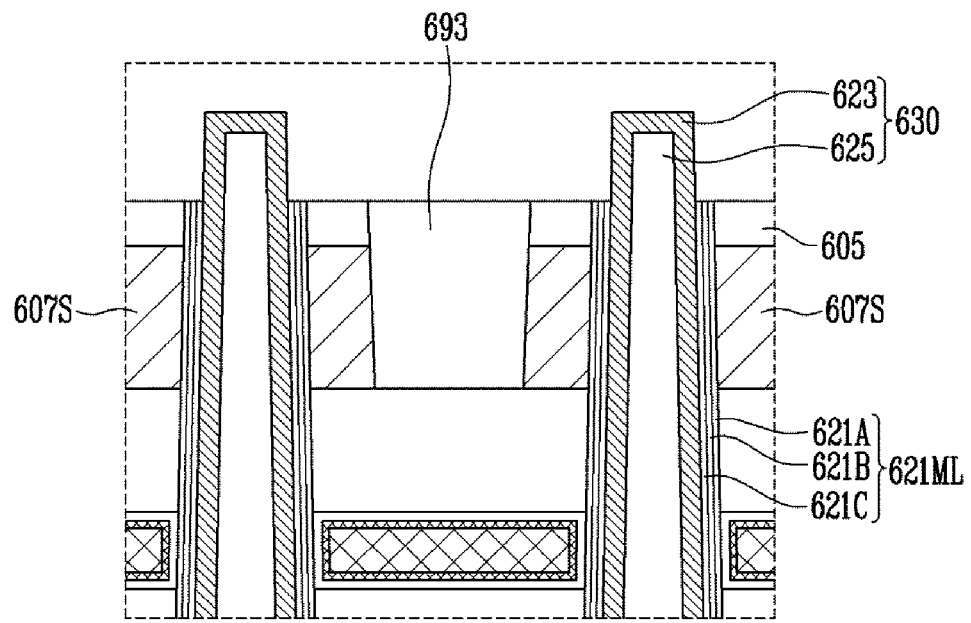

Referring to FIG. 8C, a memory pattern 621ML may be defined by sequentially performing an etching process of selectively etching the data storage layer 621B and an etching process of selectively etching the tunnel insulating layer 621C. The channel layer 623 and the core insulating layer 625 of the channel pillar 630 may protrude beyond the memory pattern 621ML, and a surface of the channel layer 623 may be exposed at a protrusion of the channel pillar 630.

While etching the data storage layer 621B and the tunnel insulating layer 621C, the portion of the source isolation insulating layer 693 may be etched, but the first insulating layer 605 may remain to surround the channel pillar 630.

Figure 8D:
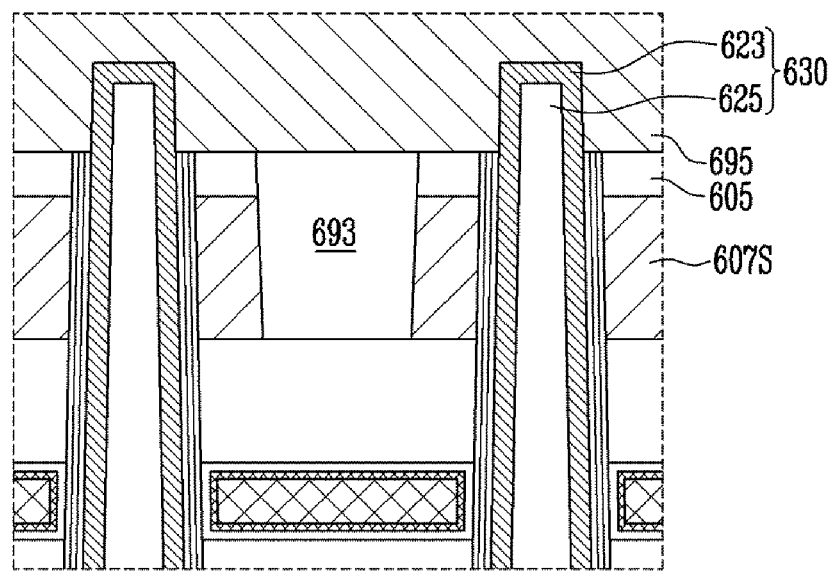

Referring to FIG. 8D, a doped semiconductor pattern 695 that is in contact with the exposed surface of the channel layer 623 may be formed. The doped semiconductor pattern 695 may configure the common source layer. The doped semiconductor pattern 695 may extend to overlap the source select lines 607S and the source isolation insulating layer 693. The doped semiconductor pattern 695 may be spaced apart from the source select lines 607S by the first insulating layer 605.

Figure 9A:
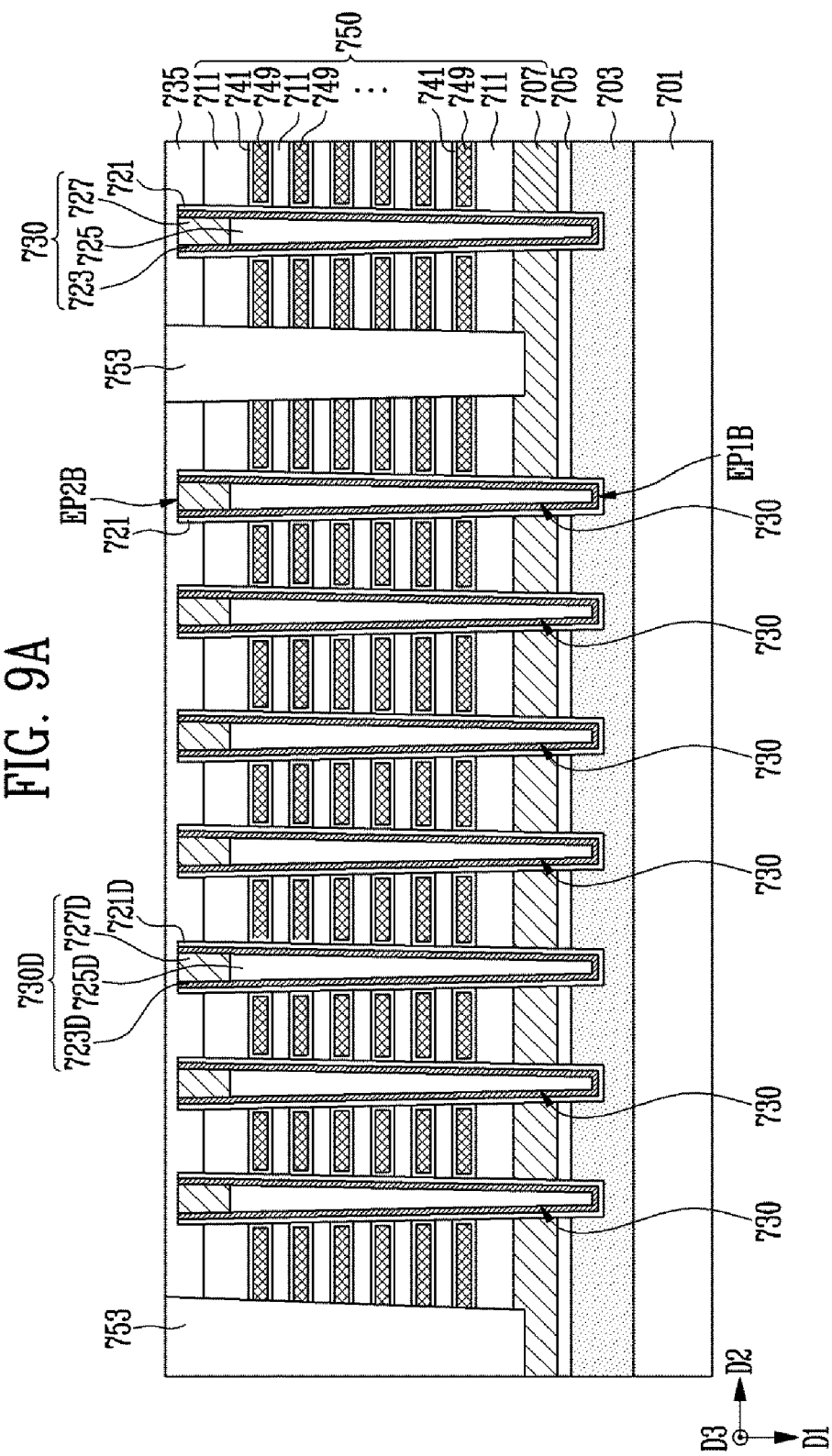
Figure 9B:
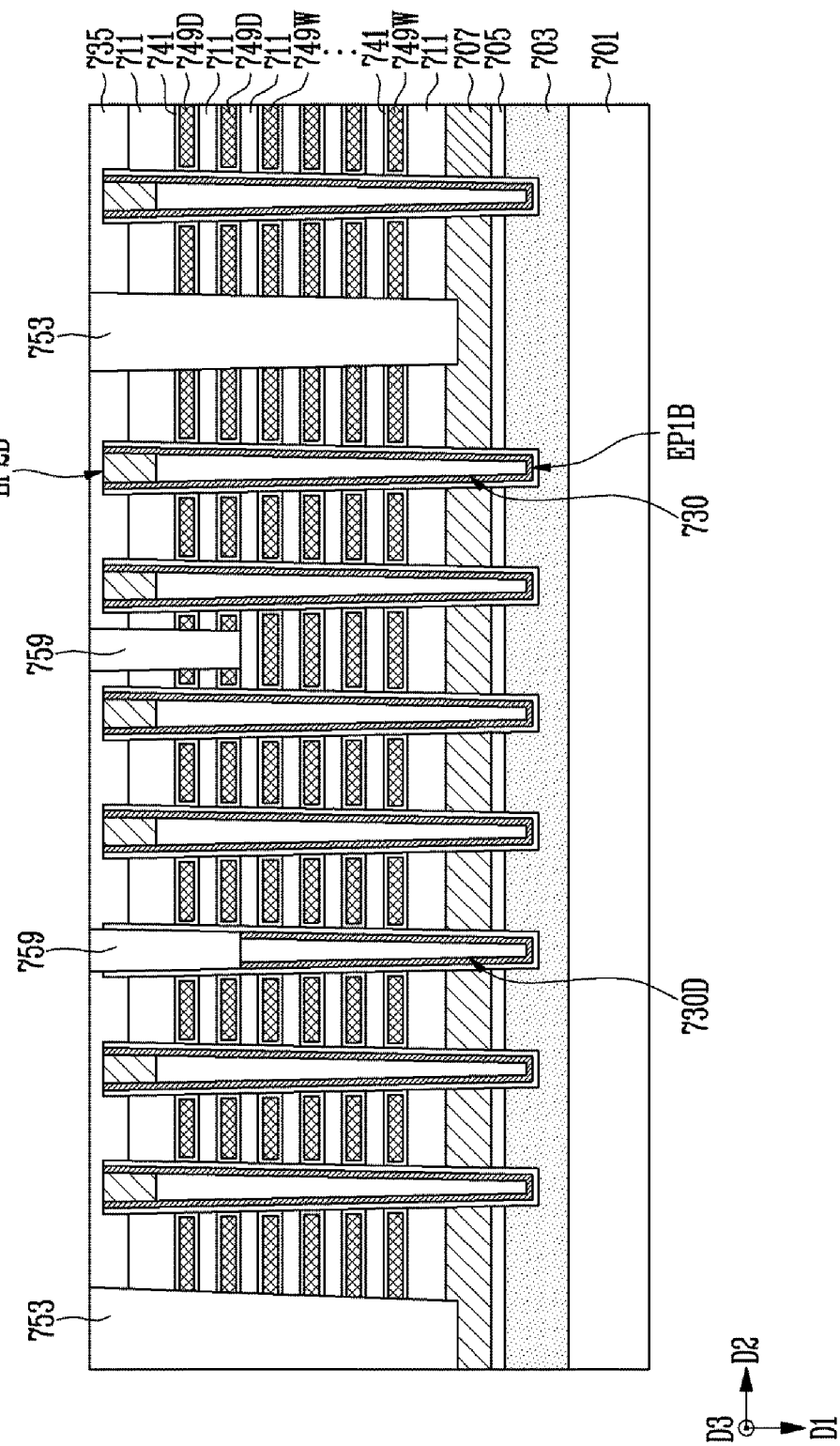

FIGS. 9A to 9C are cross-sectional views illustrating a method of manufacturing a semiconductor memory device according to an embodiment of the present disclosure.

Referring to FIG. 9A, a protective layer 703, a first insulating layer 705, and a preliminary structure 750 may be formed on a sacrificial substrate 701 by using the processes described with reference to FIGS. 7A to 7C.

Figure 10A:
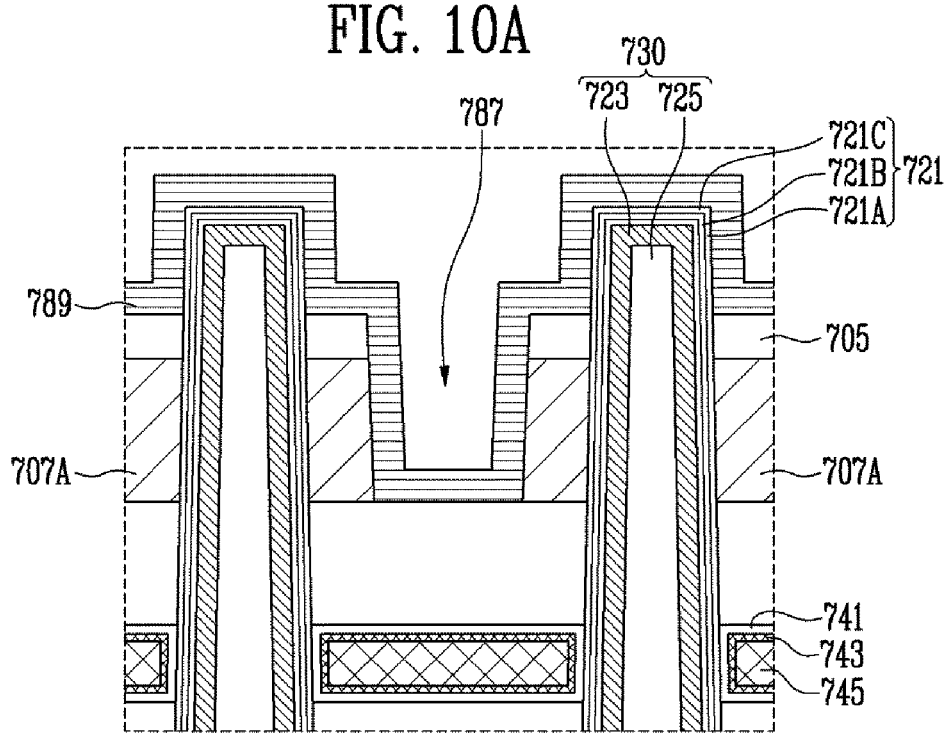
FIGS. 10A to 10C are enlarged cross-sectional views illustrating subsequent processes after a process shown in FIG. 9C.

A first conductive pattern 707 of the preliminary structure 750 may include silicon. Interlayer insulating layers 711 and second conductive patterns 749 of the preliminary structure 750 may be alternately stacked on the first conductive pattern 707. A conductive material of the second conductive patterns 749 may include a metal barrier layer 743 and a metal layer 745 as shown in FIG. 10A.

Each of channel pillars 730 of the preliminary structure 750 may have a tapered shape that tapers toward the first direction D1 facing the sacrificial substrate 701.

The interlayer insulating layers 711, the second conductive patterns 749, and the first conductive pattern 707 may be penetrated by a dummy channel pillar 730D of a shape similar to that of the channel pillars 730. The channel pillars 730 and the dummy channel pillar 730D may pass through the first insulating layer 705 and extend into the protective layer 703.

Each of the channel pillars 730 may include a core insulating layer 725, a capping pattern 727, and a channel layer 723 as described with reference to FIG. 7A. Each of the channel pillars 730 may include a first end EP1B facing the first direction D1 and a second end EP2B facing the direction opposite to the first direction D1. The memory layer 721 may extend along the first end EP1B of the channel pillar 730 and a sidewall of the channel pillar 730. As shown in FIG. 10A, the memory layer 721 may include a first blocking insulating layer 721A, a data storage layer 721B, and a tunnel insulating layer 721C.

A second blocking insulating layer 741 may be formed along a surface of each of the second conductive patterns 749.

As described with reference to FIG. 7A, the dummy channel pillar 730D may be surrounded by a dummy memory layer 721D, and may include a dummy channel layer 723D, a dummy core insulating layer 725D, and a dummy capping pattern 727D.

The second end EP2B of each of the channel pillars 730 and the dummy channel pillar 730D may be covered with a second insulating layer 735.

A gate isolation insulating layer 753 partitioning the preliminary structure 750 may be disposed on the first conductive pattern 707 without passing through the first conductive pattern 707.

Referring to FIG. 9B, after forming the gate isolation insulating layer 753, a drain isolation insulating layer 759 having a tapered shape that tapers toward the first direction D1 may be formed through the processes described with reference to FIGS. 7D and 7E. The drain isolation insulating layer 759 may divide at least one layer among the second conductive patterns 749 shown in FIG. 9A into drain select lines 749D. The second conductive pattern, which is divided into the drain select lines 749D, is adjacent to the second end EP2B of the channel pillar 730. Among the second conductive patterns 749, second conductive patterns between the drain isolation insulating layer 759 and the first conductive pattern 707 may be defined as word lines 749W.

Some regions of the drain isolation insulating layer 759 may overlap the dummy channel pillar 730D, and other regions may overlap some regions of the word line 749W that is not penetrated by the dummy channel pillar 730D.

Referring to FIG. 9C, a third insulating layer 761, a contact plug 763, a bit line 765, a first interconnection structure 768, and a first bonding metal pattern 769 may be formed through the processes described with reference to FIG. 7E. The first interconnection structure 768 and the first bonding metal pattern 769 may be buried in the first insulating structure 767 as described with reference to FIG. 7E.

Subsequently, a second bonding metal pattern 783 of a peripheral circuit structure 770 may be bonded to the first bonding metal pattern 769 through the processes described with reference to FIG. 7F. The peripheral circuit structure 770 may include a substrate 771 including transistors 775, a second insulating structure 781 covering the substrate 771, and a second interconnection structure 782 and a second bonding metal pattern 783 buried in the second insulating structure 781 as described with reference to FIG. 7F.

Subsequently, the sacrificial substrate 701 and the protective layer 703 shown in FIG. 9B may be sequentially removed. Therefore, the first insulating layer 705 may be exposed.

Thereafter, a mask pattern 785 may be formed on the first insulating layer 705. Subsequently, source trenches 787 passing through the first insulating layer 705 and the first conductive pattern 707 shown in FIG. 9B may be formed through an etching process using the mask pattern 785 as an etching barrier. The source trenches 787 may have a tapered shape that tapers in the direction opposite to the first direction D1 as described with reference to FIG. 7H.

The first conductive pattern 707 shown in FIG. 9B may be separated into preliminary select lines 707A by source trenches 787. The preliminary select lines 707A may extend in the second direction D2 and the third direction D3 in a plane crossing the channel pillars 730. The source trenches 787 may extend in the third direction D3 between the channel pillars 730. The source trenches 787 may overlap the dummy channel pillar 730D, the drain isolation insulating layer 759, and the gate isolation insulating layer 753.

Figure 10B:
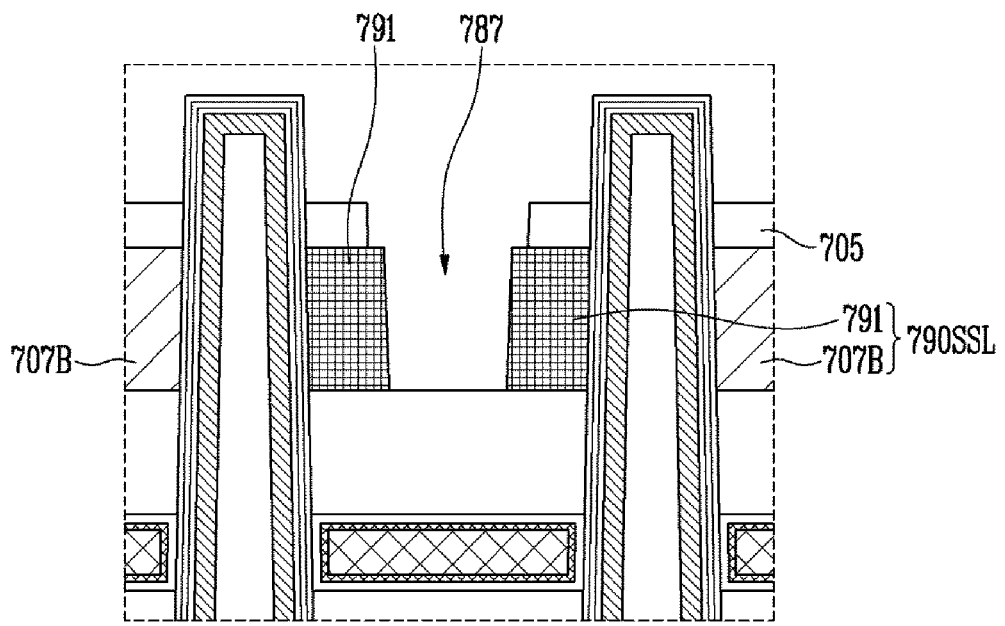
Figure 10C:
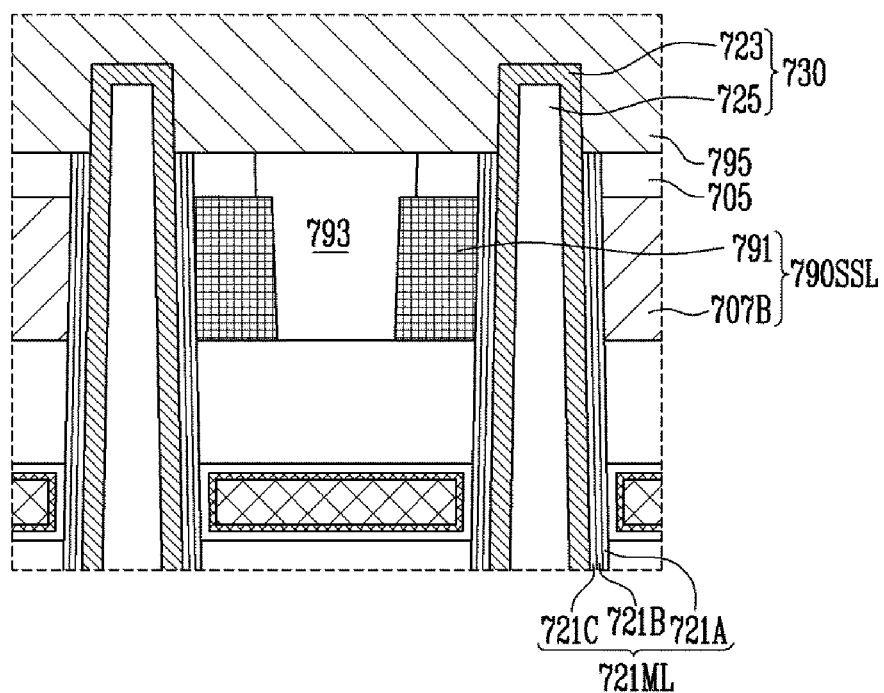

FIGS. 10A to 10C are enlarged cross-sectional views illustrating subsequent processes after the process shown in FIG. 9C. FIG. 10A to 10C are enlarged cross-sectional views of a region RB shown in FIG. 9C.

Referring to FIG. 10A, the first insulating layer 705 and the memory layer 721 may be exposed by removing the mask pattern 785 shown in FIG. 9C. Subsequently, a metal layer 789 may be formed on a sidewall of the preliminary select line 707A exposed through the source trench 787. The metal layer 789 may extend along a surface of the source trench 787. The metal layer 789 may extend along a surface of the first insulating layer 705 and a surface of the memory layer 721.

The metal layer 789 may include a conductive material capable of providing a metal silicide layer by reacting with the preliminary select line 707A through a silicide process performed at a temperature of 450° C. or less. In an embodiment, the metal layer 789 may include nickel.

Referring to FIG. 10B, a portion of the preliminary select line 707A shown in FIG. 10A may be converted into a metal silicide layer by performing the silicide process at the temperature of 450° C. or less. Thereafter, a metal layer remained without reacting with the silicon layer may be removed. Some regions of the preliminary select line 707A shown in FIG. 10A might not be converted into the metal silicide layer and may remain as a silicon layer. The remained silicon layer may configure a first select pattern 707B. In addition, the metal silicide layer may configure a second select pattern 791 extending along a sidewall of the first select pattern 707B.

A source select line 790SSL including the first select pattern 707B and the second select pattern 791 may be defined by the above-described process. The second select pattern 791 configured of the metal silicide layer may compensate a resistance of the first select pattern 707B configured of the silicon layer, thereby reducing a resistance of the source select line 790SSL.

In a high temperature process exceeding 450° C., a defect may occur in the first bonding metal pattern 769 and the second bonding metal pattern 783 shown in FIG. 9C. Since the silicide process according to an embodiment of the present disclosure is performed at a low temperature of 450° C. or less, according to the embodiment of the present disclosure, in the first bonding metal pattern 769 and the second bonding metal pattern 783 shown in FIG. 9C, defect occurrence due to a high temperature may be reduced.

Referring to FIG. 10C, the source trench 787 shown in FIG. 10B may be filled with the source isolation insulating layer 793 using the process described with reference to FIG. 8B.

Subsequently, a memory pattern 721M may be defined by sequentially performing the etching process of the first blocking insulating layer 721A, the etching process of the data storage layer 721B, and the etching process of the tunnel insulating layer 721C as described with reference to FIGS. 8B and 8C. The channel layer 723 and the core insulating layer 725 of the channel pillar 730 may protrude beyond the memory pattern 721ML, and a surface of the channel layer 723 may be exposed at a protrusion of the channel pillar 730.

Thereafter, a doped semiconductor pattern 795 that is in contact with the surface of the exposed channel layer 723 may be formed.

FIGS. 11A to 11D are enlarged cross-sectional views illustrating a method of manufacturing a semiconductor memory device according to an embodiment of the present disclosure.

Before performing processes shown in FIGS. 11A to 11D, the processes described with reference to FIGS. 9A to 9C may be preceded. Accordingly, preliminary select lines 707S' divided by the source trench 787' may be formed.

The preliminary select lines 707S' may overlap a stack of a conductive pattern 749' and an interlayer insulating layer 711'. The conductive pattern 749', the interlayer insulating layer 711', and the preliminary select lines 707S' may surround a channel pillars 730'. The channel pillars 730' may have a tapered shape that tapers toward the first direction D1. The channel pillars 730' may include a core insulating layer 725' and a channel layer 723'. A sidewall of each of the channel pillars 730' may be surrounded by a memory layer 721'.

The memory layer 721' may extend to cover a first end EP1C of each of the channel pillars 730' facing the first direction D1. The memory layer 721' may include a first blocking insulating layer 721A', a data storage layer 721B', and a tunnel insulating layer 721C'.

The preliminary select lines 707S' may be disposed closer to the first end EP1C of the channel pillar 730' than the conductive pattern 749'. Each of the preliminary select lines 707S' may be configured of a silicon layer.

The conductive pattern 749' may include a metal barrier layer 743' and a metal layer 745'. A second blocking insulating layer 741' may be disposed between the conductive pattern 749' and the memory layer 721'. The second blocking insulating layer 741' may extend between the conductive pattern 749' and the interlayer insulating layer 711'.

A source trench 787' may extend to pass through the first insulating layer 705'. A portion of each of the preliminary select lines 707S' may be etched through the source trench 787'. Therefore, a groove 788' may be defined between the first insulating layer 705' and the interlayer insulating layer 711'.

A mask pattern 785' may serve as an etching barrier during an etching process for forming the source trench 787'. The mask pattern 785' may protect the memory layer 721' and the channel pillar 730' during an etching process for forming the groove 788'.

Figure 11A:
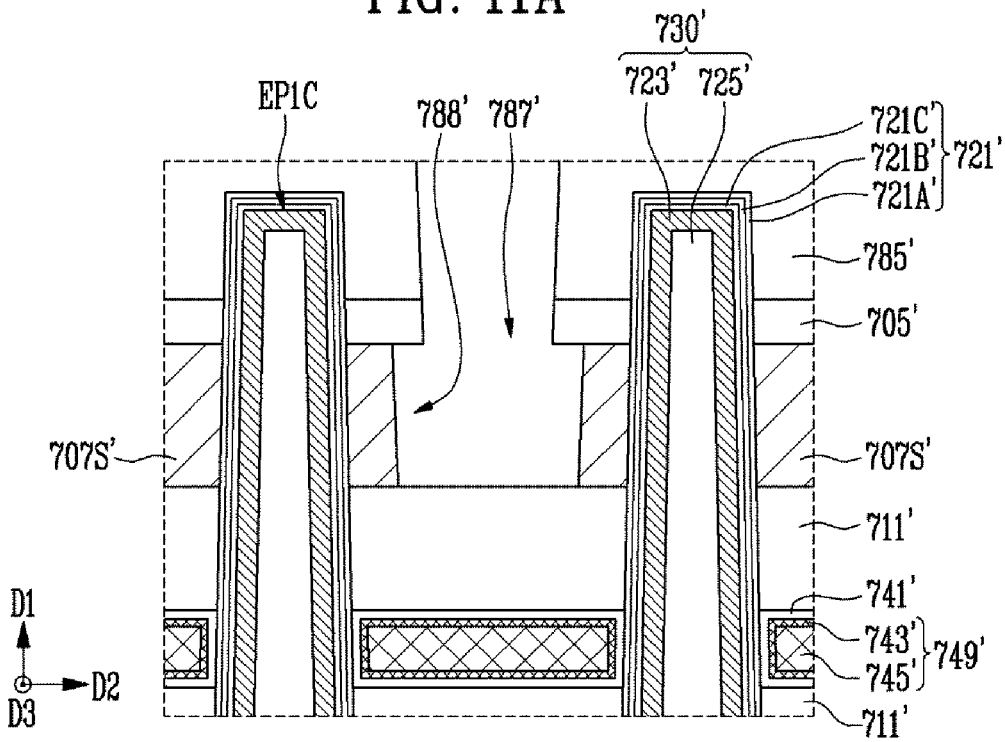
FIGS. 11A to 11D are enlarged cross-sectional views illustrating a method of manufacturing a semiconductor memory device according to an embodiment of the present disclosure.
Figure 11B:
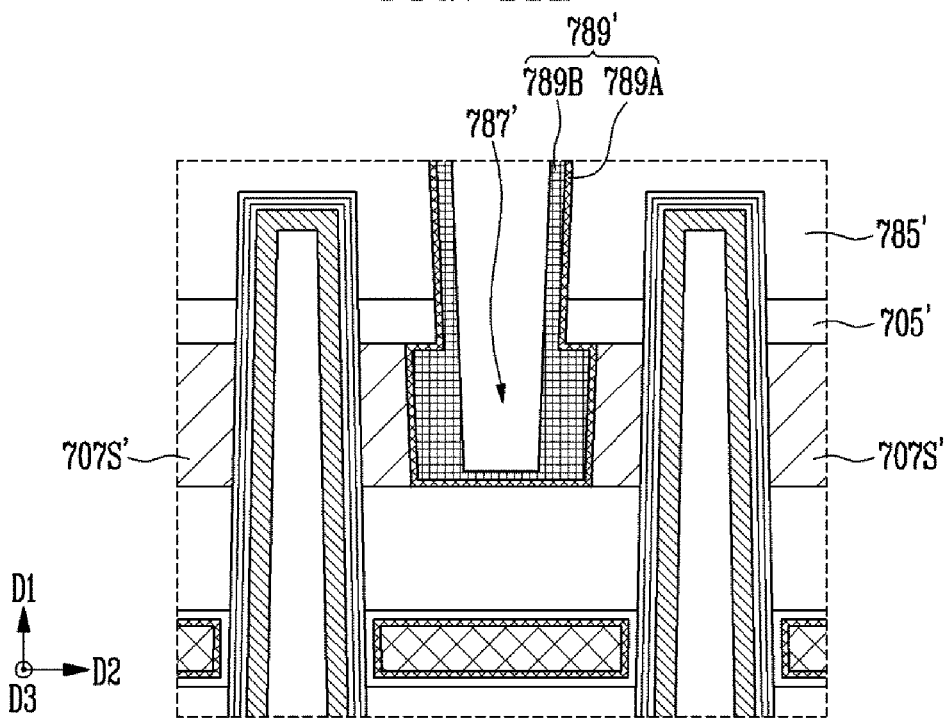

Referring to FIG. 11B, the groove 788' shown in FIG. 11A may be filled with a conductive layer 789'. The conductive layer 789' may include various conductive materials that may be deposited in a process of 450° C. or less. In an embodiment, the conductive layer 789' may include various conductive materials deposited by a physical vapor deposition (PVD) method or an atomic layer deposition method. The conductive layer 789' may include a metal layer 789B and a metal barrier layer 789A between the metal layer 789B and the preliminary select line 707S'. The metal barrier layer 789A may be in contact with a sidewall of the preliminary select line 707S'. The metal layer 789B and the metal barrier layer 789A may compensate for a resistance of the preliminary select line 707S' configured of a silicon layer.

Because the conductive layer 789' for compensating for the resistance of the silicon layer is formed at a low temperature of 450° C. or less, according to an embodiment of the present disclosure, in the first bonding metal pattern 769 and the second bonding metal pattern 783 shown in FIG. 9C, the defect occurrence due to a high temperature may be reduced.

Figure 11C:
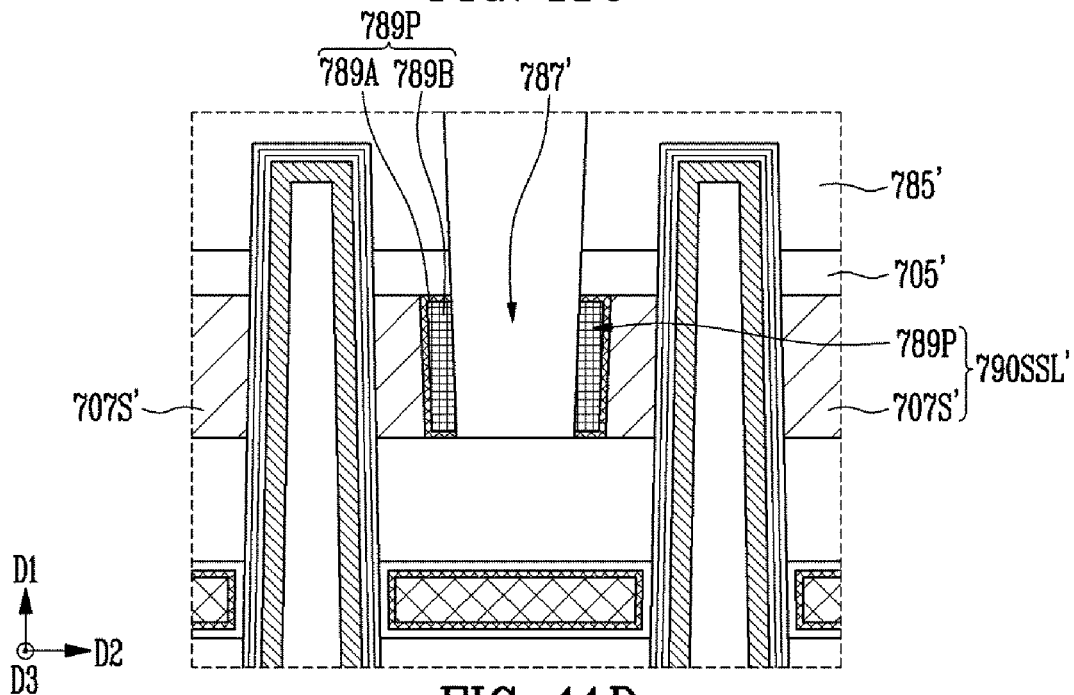

Referring to FIG. 11C, the metal layer 789B and the metal barrier layer 789A in the source trench 787' may be removed by an etching process such as etch-back. Therefore, a source select line 790SSL' including a sidewall conductive pattern 789P and the preliminary select line 707S' may be defined. The sidewall conductive pattern 789P may remain on a sidewall of the preliminary select line 707S'.

Figure 11D:
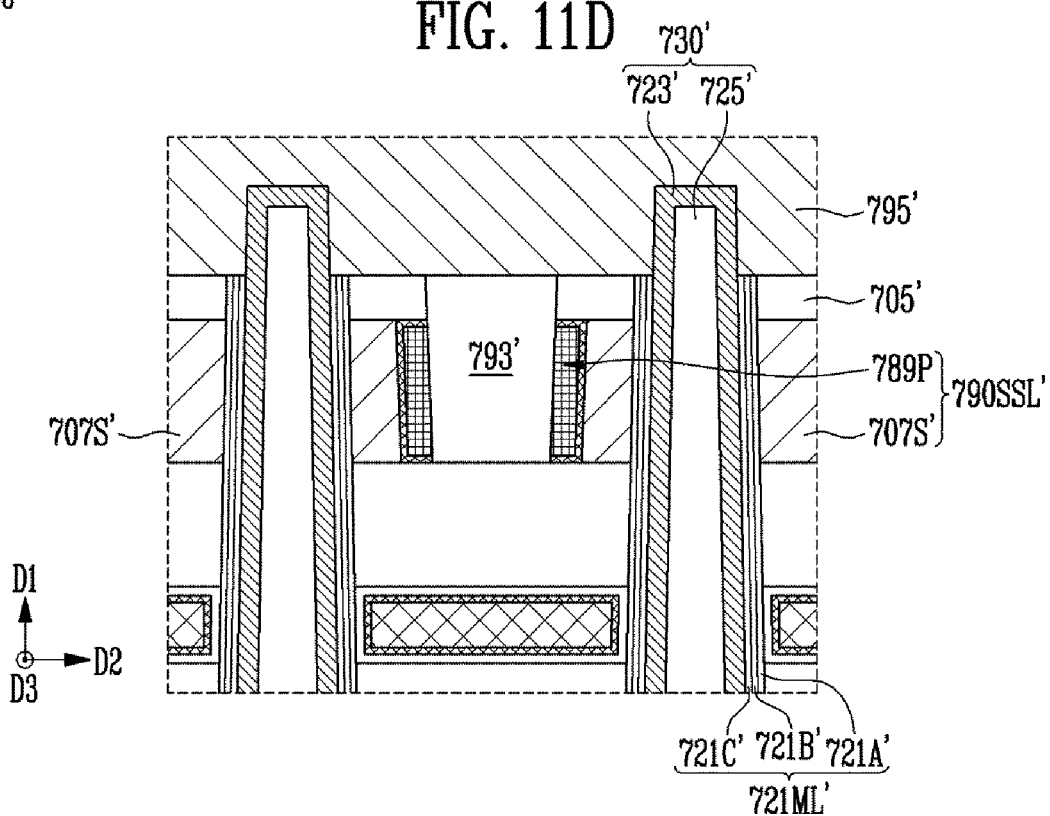

Referring to FIG. 11D, the source trench 787' shown in FIG. 11C may be filled with a source isolation insulating layer 793' by using the process described with reference to FIG. 8B.

Subsequently, a memory pattern 721ML' may be defined by sequentially performing the etching process of the first blocking insulating layer 721A', the etching process of the data storage layer 721B', and the etching process of the tunnel insulating layer 721C' as described with reference to FIGS. 8B and 8C. In addition, the channel layer 723' and the core insulating layer 725' of the channel pillar 730' may protrude beyond the memory pattern 721ML, and a surface of the channel layer 723' may be exposed at a protrusion of the channel pillar 730'.

Thereafter, a doped semiconductor pattern 795' that is in contact with the exposed surface of the channel layer 723' may be formed.

FIGS. 12A to 12D are cross-sectional views illustrating a method of manufacturing a semiconductor memory device according to an embodiment of the present disclosure.

Referring to FIG. 12A, after forming a first insulating layer 805 on a sacrificial substrate 801, sacrificial layers 813 and interlayer insulating layers 811 may be alternately stacked on the first insulating layer 805.

The first insulating layer 805 may include a silicon oxide layer. The sacrificial layers 813 may include a silicon nitride layer. The interlayer insulating layers 811 may include a silicon oxide layer.

Channel pillars 830 may be formed using the processes described with reference to FIG. 7A. While forming the channel pillars 830, dummy channel pillars 830D may be formed. The channel pillars 830 and the dummy channel pillars 830D may extend into a sacrificial substrate 801.

Each of the channel pillars 830 may include a first end EP1D and a second end EP2D facing in opposite directions. The first end EP1D may face the first direction D1. A sidewall of the channel pillar 830 may be surrounded by a memory layer 821. The memory layer 821 may extend between the first end EP1D and the sacrificial substrate 801. The channel pillar 830 may include a channel layer 823, a core insulating layer 825, and a capping pattern 827. The channel pillars 830 may have a tapered shape that tapers toward the first end EP1D. The memory layer 821 may include a first blocking insulating layer 821A, a data storage layer 821B, and a tunnel insulating layer 821C shown in FIG. 13A.

The dummy channel pillar 830D may be surrounded by a dummy memory layer 821D. The dummy channel pillar 830D may include a dummy channel layer 823D, a dummy core insulating layer 825D, and a dummy capping pattern 827D.

The channel pillars 830 and the dummy channel pillar 830D may be covered with a second insulating layer 835.

The second insulating layer 835, the interlayer insulating layers 811, the sacrificial layers 813, and the first insulating layer 805 may be penetrated by a slit 837.

Referring to FIG. 12B, the sacrificial layers 813 shown in FIG. 12A may be replaced with conductive patterns 849 through the slit 837. The conductive patterns 849 may be formed of the same conductive material. Each of the conductive patterns 849 may include a metal barrier layer 843 and a metal layer 845 as shown in FIG. 13A. Before forming the conductive patterns 849, a second blocking insulating layer 841 may be formed on a surface of each of regions in which the sacrificial layers 813 shown in FIG. 12A are removed.

Through the processes described above with reference to FIGS. 12A and 12B, a preliminary structure 850 including the channel pillars 830 having the tapered shape, and the conductive patterns 849 and the interlayer insulating layers 811 surrounding the channel pillars 830 and alternately stacked on the first insulating layer 805 may be formed.

Figure 12C:
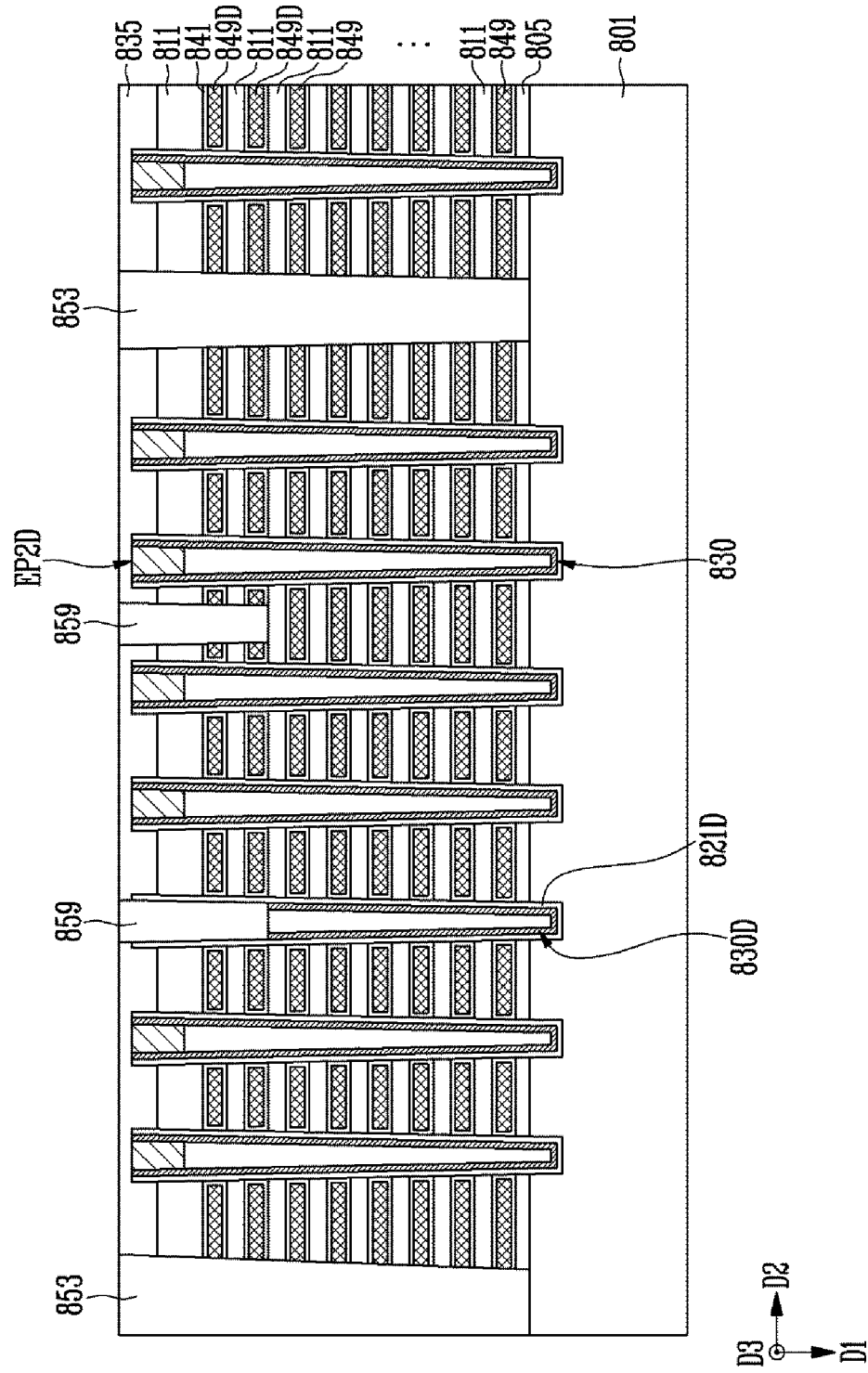
Figure 13A:
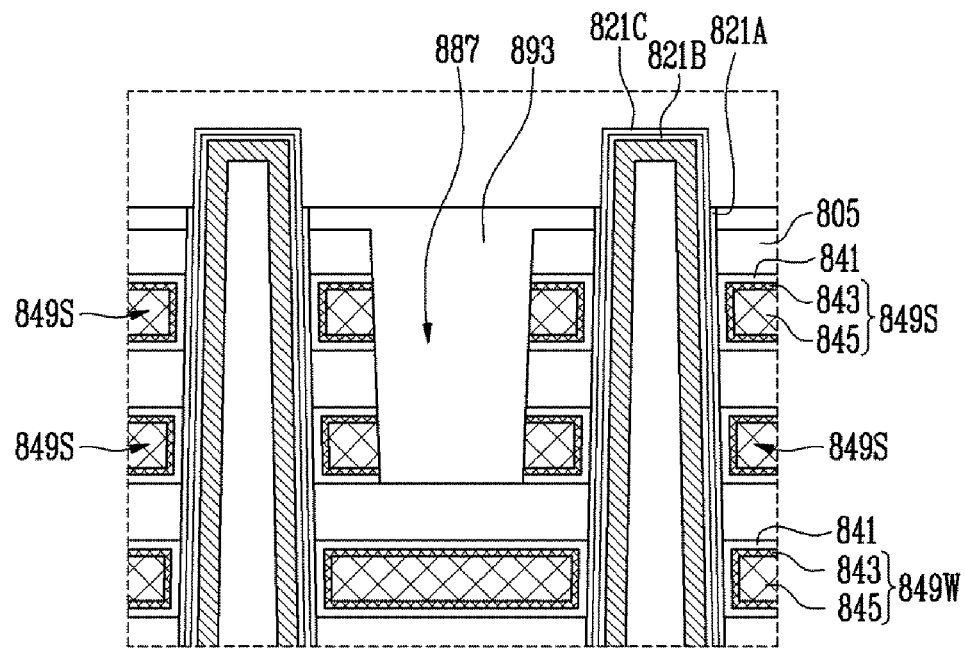
FIGS. 13A and 13B are enlarged cross-sectional views illustrating subsequent processes after the process shown in FIG. 12D.

Referring to FIG. 12C, the slit 837 shown in FIG. 12B may be filled with a gate isolation insulating layer 853. Subsequently, a drain isolation insulating layer 859 passing through at least one layer among the conductive patterns 849 shown in FIG. 12B may be formed. The conductive pattern penetrated by the drain isolation insulating layer 859 is adjacent to the second end EP2D of the channel pillar 830.

The conductive pattern adjacent to the second end EP2D may be separated into drain select lines 849D by the drain isolation insulating to layer 859. The drain select lines 849D may extend in the second direction D2 and the third direction D3 in a plane crossing the channel pillars 830 to surround the channel pillars 830. The drain isolation insulating layer 859 may extend in the third direction D3 between the channel pillars 830. The drain isolation insulating layer 859 may have a tapered shape that tapers toward the first direction D1.

The drain isolation insulating layer 859 may include a region overlapping the dummy channel pillar 830D and a region not overlapping the dummy channel pillar 830D.

Figure 12D:
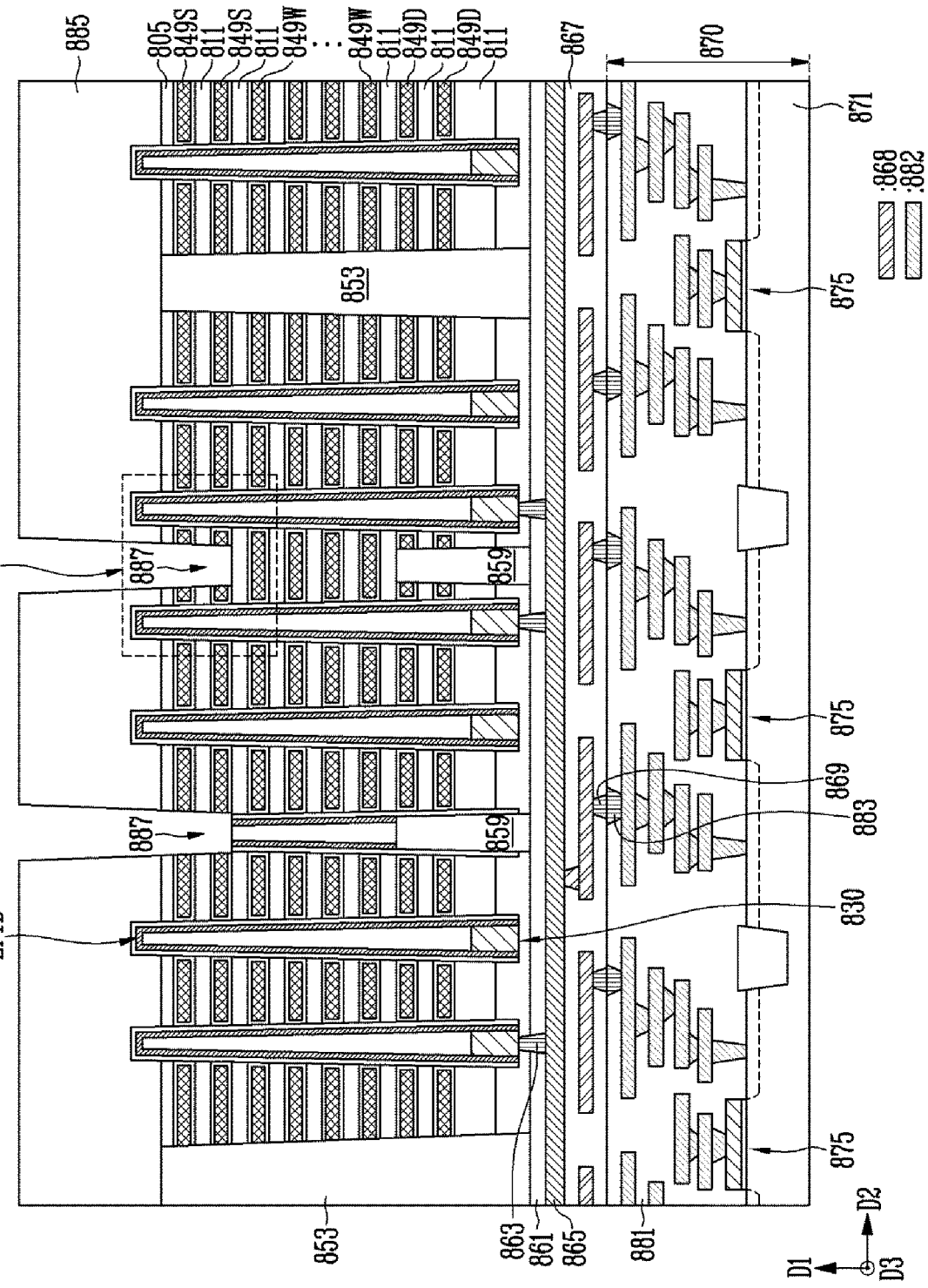

Referring to FIG. 12D, a third insulating layer 861, a contact plug 863, a bit line 865, a first interconnection structure 868, and a first bonding metal pattern 869 may be formed using the processes described with reference to FIG. 7E. The first interconnection structure 868 and the first bonding metal pattern 869 may be buried in a first insulating structure 867 as described with reference to FIG. 7E.

Subsequently, a second bonding metal pattern 883 of a peripheral circuit structure 870 may be bonded to the first bonding metal pattern 869 through processes described with reference to FIG. 7F. As described with reference to FIG. 7F, the peripheral circuit structure 870 may include a substrate 871 including transistors 875, a second insulating structure 881 covering the substrate 871, and a second interconnection structure 882 and a second bonding metal pattern 883 buried in the second insulating structure 881.

Subsequently, the sacrificial substrate 801 shown in FIG. 12C may be removed. Therefore, the first insulating layer 805 may be exposed.

Thereafter, a mask pattern 885 may be formed on the first insulating layer 805. Subsequently, source trenches 887 may be formed through an etching process using the mask pattern 885 as an etching barrier. The source trenches 887 may pass through at least one layer among the conductive patterns 849 shown in FIG. 12C. The conductive pattern penetrated by the source trenches 887 is adjacent to the first end EP1D of the channel pillar 830. The source trench 887 may have a tapered shape that tapers toward the direction opposite to the first direction D1 as described with reference to FIG. 7H.

The conductive pattern penetrated by the source trenches 887 may be separated into source select lines 849S. The source select lines 849S may extend in the second direction D2 and the third direction D3 to surround the channel pillars 830. The source trench 887 may extend in the third direction D3 between the channel pillars 830. The source trench 887 may overlap the drain isolation insulating layer 859.

Figure 13B:
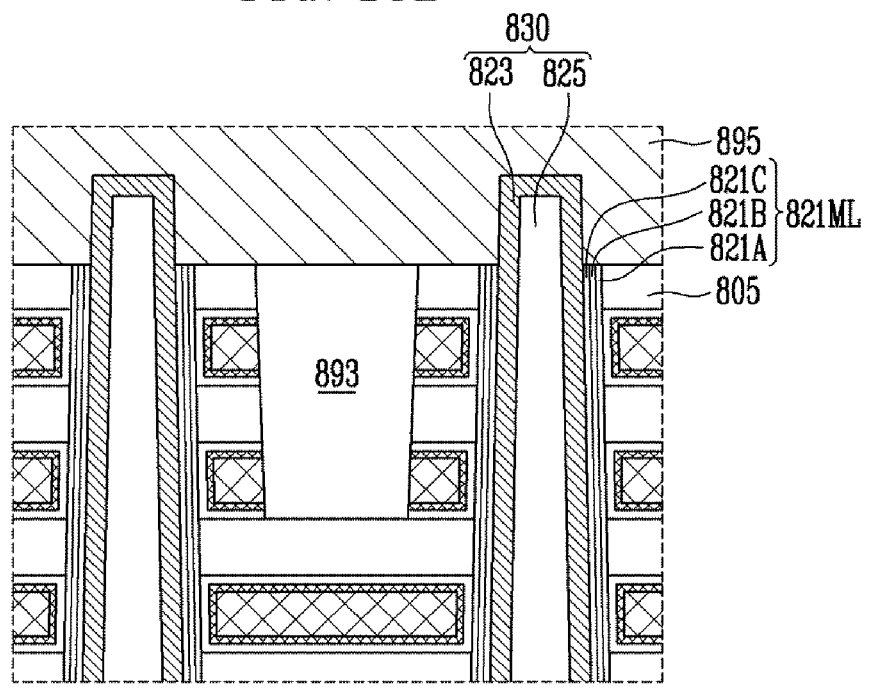

FIGS. 13A and 13B are enlarged cross-sectional views illustrating subsequent processes after the process shown in FIG. 12D. FIGS. 13A and 13B are enlarged cross-sectional views of a region RC shown in FIG. 12D.

Referring to FIG. 13A, the first insulating layer 805 may be exposed by removing the mask pattern 885 shown in FIG. 12D. Subsequently, the source trench 887 may be filled with a source isolation insulating layer 893. As described with reference to FIG. 8B, in a process of forming the source isolation insulating layer 893, the first blocking insulating layer 821A may be etched, and the data storage layer 821B may be exposed.

The source isolation insulating layer 893 may electrically insulate adjacent source select lines 849S at the same level. The source isolation insulating layer 893 may overlap some regions of a word line 849W overlapping the source trench 887.

Referring to FIG. 13B, a memory pattern 821ML may be defined by sequentially performing the etching process of the data storage layer 821B and the etching process of the tunnel insulating layer 821C as described with reference to FIG. 8C. The channel layer 823 and the core insulating layer 825 of the channel pillar 830 may protrude beyond the memory pattern 821ML, and a surface of the channel layer 823 may be exposed at a protrusion of the channel pillar 830.

Thereafter, a doped semiconductor pattern 895 that is in contact with the exposed surface of the channel layer 823 may be formed.

The source isolation insulating layer 893 according to an embodiment of the present disclosure is formed after replacing the sacrificial layers 813 shown in FIG. 12A with the conductive patterns 849 shown in FIG. 12B. Accordingly, the embodiment of the present disclosure may design a layout of the source isolation insulating layer 893 without a design restriction for inflow of an etching material or a conductive material in order to replace the sacrificial layers 813 shown in FIG. 12A with the conductive patterns 849 shown in FIG. 12B. Therefore, according to an embodiment of the present disclosure, design freedom for the source isolation insulating layer 893 may be improved.

Figure 14:
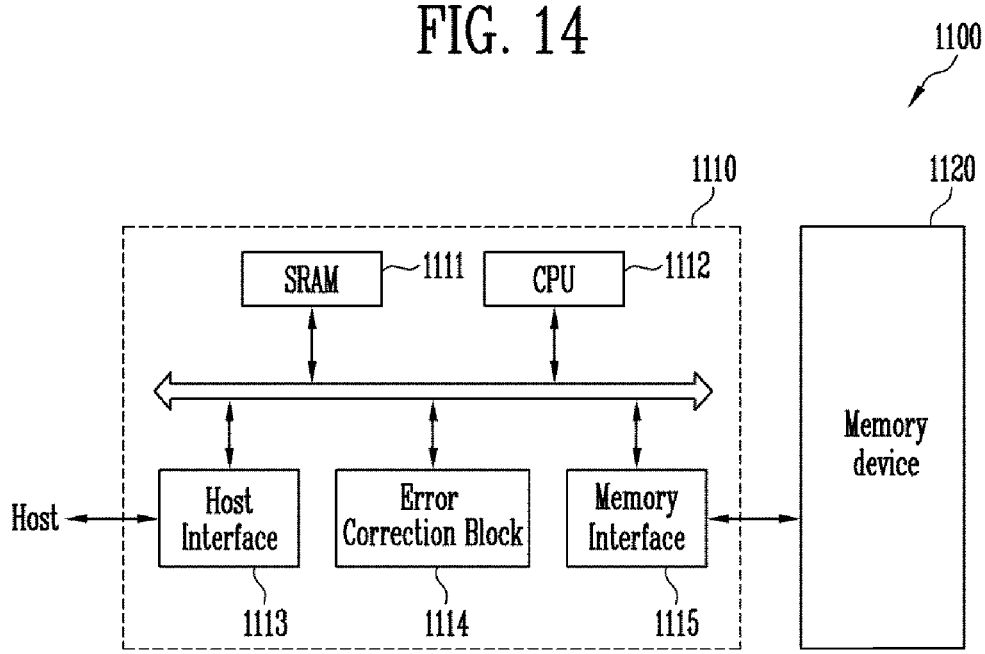
FIG. 14 is a block diagram illustrating a configuration of a memory system according to an embodiment of the present disclosure.

FIG. 14 is a block diagram illustrating a configuration of a memory system 1100 according to an embodiment of the present disclosure.

Referring to FIG. 14, the memory system 1100 may include a memory device 1120 and a memory controller 1110.

The memory device 1120 may include channel pillars having a tapered shape, a source isolation insulating layer having a tapered shape that is inverse to the tapered shape of the channel pillar, and source select lines surrounding the channel pillars and separated from each other at the same level. The source isolation insulating layer may be disposed between the source select lines.

The memory device 1120 may be a multi-chip package configured of a plurality of flash memory chips.

The memory controller 1110 may be configured to control the memory device 1120. The memory controller 1110 may include a static random access memory (SRAM) 1111, a central processing unit (CPU) 1112, a host interface 1113, an error correction block 1114, and a memory interface 1115. The SRAM 1111 may be used as an operation memory of the CPU 1112, the CPU 1112 may perform an overall control operation for data exchange of the memory controller 1110, and the host interface 1113 may include a data exchange protocol of a host that is connected to the memory system 1100. In addition, the error correction block 1114 may detect and correct an error included in data read from the memory device 1120. The memory interface 1115 may perform an interfacing with the memory device 1120. In addition, the memory controller 1110 may further include a read only memory (ROM) or the like for storing code data for interfacing with the host.

Figure 15:
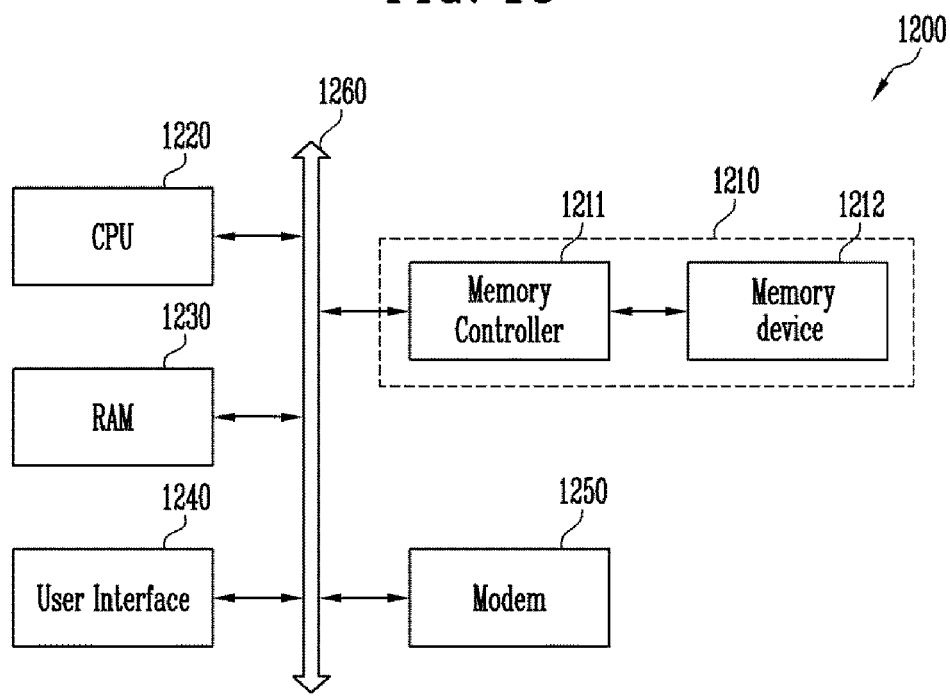
FIG. 15 is a block diagram illustrating a configuration of a computing system according to an embodiment of the present disclosure.

FIG. 15 is a block diagram illustrating a configuration 1200 of a computing system according to an embodiment of the present disclosure.

Referring to FIG. 15, the computing system 1200 may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may include a memory device 1212 and a memory controller 1211. The memory device 1212 may include channel pillars having a tapered shape, a source isolation insulating layer having a tapered shape that is inverse to the tapered shape of the channel pillar, and source select lines surrounding the channel pillars and separated from each other at the same level. The source isolation insulating layer may be disposed between the source select lines.

According to the present disclosure, because the source isolation insulating layer, which is disposed between the channel pillars, tapers in an opposite direction to the channel pillars, an alignment margin of the source isolation insulating layer may be improved between the channel pillars.

What is claimed is:

1. A semiconductor memory device comprising:
    a gate stack including interlayer insulating layers and word lines alternately stacked in a first direction;
    channel pillars passing through the gate stack and tapering toward the first direction;
    source select lines surrounding the channel pillars and extending to overlap the gate stack; and
    a source isolation insulating layer overlapping the gate stack between the source select lines and tapering toward a direction opposite to the first direction.

2. The semiconductor memory device of claim 1, wherein the gate stack further comprises:
    drain select lines respectively overlapping the source select lines with the word lines interposed between the drain select lines and the source select lines; and
    a drain isolation insulating layer disposed between the drain select lines and tapering toward the first direction.

3. The semiconductor memory device of claim 2, wherein the source isolation insulating layer overlaps the drain isolation insulating layer.

4. The semiconductor memory device of claim 2, wherein:
    the channel pillars include a first channel pillar and a second channel pillar;
    the drain select lines include a first drain select line surrounding the first channel pillar and a second drain select line surrounding the second channel pillar, wherein the second drain select line is spaced apart from the first drain select line by the drain isolation insulating layer; and
    the source select lines include a first source select line surrounding the first channel pillar and a second source select line surrounding the second channel pillar, wherein the second source select line is spaced apart from the first source select line by the source isolation insulating layer.

5. The semiconductor memory device of claim 1, wherein each of the source select lines includes silicon.

6. The semiconductor memory device of claim 1, wherein each of the source select lines includes:
    a silicon layer; and
    a metal silicide layer that is in contact with the silicon layer between the silicon layer and the source isolation insulating layer.

7. The semiconductor memory device of claim 1, wherein:
    each of the source select lines includes a silicon layer and a sidewall conductive pattern disposed between the silicon layer and the source isolation insulating layer; and
    the sidewall conductive pattern includes a metal barrier layer that is in contact with the silicon layer, and a metal layer disposed between the metal barrier layer and the source isolation insulating layer.

8. The semiconductor memory device of claim 1, wherein the source select lines and the word lines include the same conductive material.

9. The semiconductor memory device of claim 8, wherein each of the source select lines includes conductive patterns of at least two layers stacked to be spaced apart from each other in the first direction.

10. The semiconductor memory device of claim 1, further comprising:
    a common source layer in contact with the channel pillars, wherein the common source layer overlaps the gate stack with the source select lines interposed between the common source layer and the gate stack;
    a bit line connected to the channel pillars, wherein the bit line overlaps the common source layer with the gate stack interposed between the bit line and the common source layer; and
    a peripheral circuit structure overlapping the gate stack with the bit line interposed between the peripheral circuit structure and the gate stack.

* * * * *